US011011426B2

(12) United States Patent
Liao

(10) Patent No.: US 11,011,426 B2
(45) Date of Patent: May 18, 2021

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventor: Han-Wen Liao, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/427,181

(22) Filed: May 30, 2019

(65) Prior Publication Data

US 2020/0161188 A1 May 21, 2020

Related U.S. Application Data

(60) Provisional application No. 62/770,673, filed on Nov. 21, 2018.

(51) Int. Cl.

| | |
|---|---|
| ***H01L 21/8234*** | (2006.01) |
| ***H01L 29/66*** | (2006.01) |
| ***H01L 21/02*** | (2006.01) |
| ***H01L 21/268*** | (2006.01) |
| ***H01L 21/66*** | (2006.01) |
| ***H01L 27/088*** | (2006.01) |

(Continued)

(52) U.S. Cl.

CPC .. *H01L 21/823431* (2013.01); *H01L 21/0217* (2013.01); *H01L 21/02057* (2013.01); *H01L 21/268* (2013.01); *H01L 21/823418* (2013.01); *H01L 22/12* (2013.01); *H01L 27/0886* (2013.01); *H01L 29/66545* (2013.01); *H01L 29/66636* (2013.01); *H01L 29/66795* (2013.01); *H01L 21/31116* (2013.01); *H01L 21/67167* (2013.01)

(58) Field of Classification Search

CPC ....... H01L 21/823431; H01L 29/66795; H01L 21/0217; H01L 21/268; H01L 29/66636; H01L 29/66545; H01L 21/02057; H01L 21/823418; H01L 22/12; H01L 27/0886; H01L 21/31116; H01L 21/67167; H01L 21/823864; H01L 21/823814; H01L 21/67201; H01L 29/7848; H01L 29/165; H01L 27/0924; H01L 29/785; H01L 21/823821

See application file for complete search history.

(56) References Cited

U.S. PATENT DOCUMENTS

| | | | |
|---|---|---|---|
| 10,319,841 B2 * | 6/2019 | Cho | H01L 21/3083 |
| 2002/0028322 A1 | 3/2002 | Yasuda et al. | |
| 2014/0203338 A1 | 7/2014 | Kelly et al. | |

(Continued)

OTHER PUBLICATIONS

H. G. J. Moseley, M. A., "The High Frequency Spectra of the Elements", Philosophical Magazine, 1913, pp. 1024.

*Primary Examiner* — Karen Kusumakar
(74) *Attorney, Agent, or Firm* — Maschoff Brennan

(57) ABSTRACT

A method for manufacturing a semiconductor device includes forming a semiconductor fin over a substrate. A fin spacer is formed on a sidewall of the semiconductor fin. An e-beam treatment is performed on the fin spacer. An epitaxial structure is formed over the semiconductor fin. The epitaxial structure is in contact with the e-beam treated fin spacer.

20 Claims, 40 Drawing Sheets

(51) Int. Cl.
*H01L 21/311* (2006.01)
*H01L 21/67* (2006.01)

(56) References Cited

U.S. PATENT DOCUMENTS

| | | | | |
|---|---|---|---|---|
| 2015/0093862 | A1* | 4/2015 | Nainani | H01L 29/66795 438/197 |
| 2016/0035875 | A1 | 2/2016 | Alptekin et al. | |
| 2016/0197075 | A1* | 7/2016 | Li | H01L 21/823807 257/369 |
| 2017/0170291 | A1 | 6/2017 | Mulfinger et al. | |
| 2020/0066593 | A1* | 2/2020 | Lee | H01L 21/02532 |
| 2020/0152509 | A1* | 5/2020 | Greene | H01L 21/76834 |

* cited by examiner

Y
Z 260
104
102
154b
154b
154a
154a
112b
112b
112a
112a
HSn
342
Dn
Wsn
344
DG
344
X
Y 160a
114b
110
DG
152
270
160a

X
Z

SEMICONDUCTOR DEVICE AND MANUFACTURING METHOD THEREOF

PRIORITY CLAIM AND CROSS-REFERENCE

This application claims priority to U.S. Provisional Application Ser. No. 62/770,673, filed Nov. 21, 2018, which is herein incorporated by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies, and sources and drains are formed by using an epitaxial growth method.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
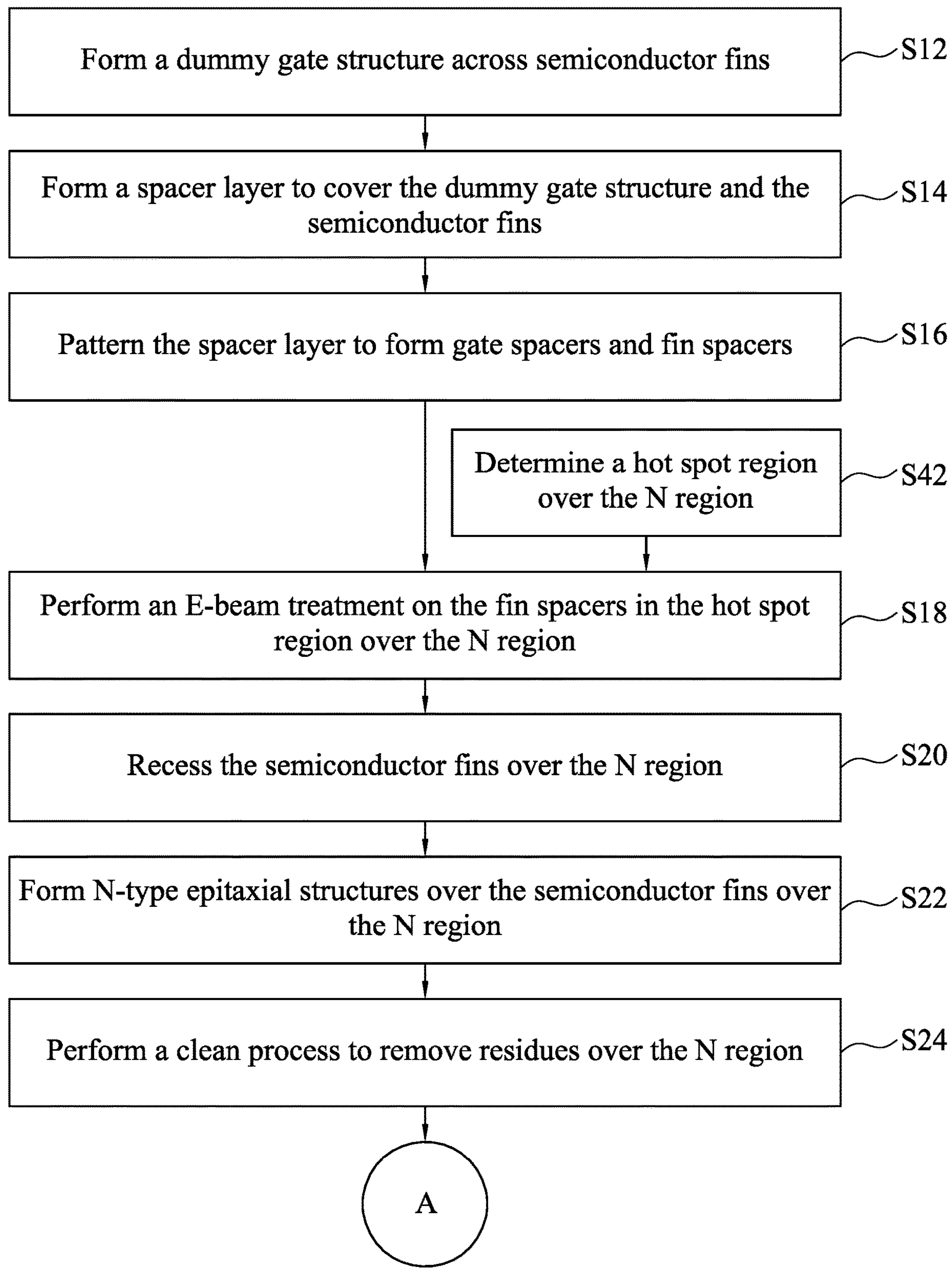
FIGS. 1A and 1B are a method of forming a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

Disclosed embodiments relate to methods and structures of forming separated source/drain structures with e-beam treated fin side walls for fin field-effect transistors (FinFETs). The embodiments such as those disclosed herein are generally applicable not only to FinFETs but also to a double-gate, surround-gate, omega-gate or gate-all-around transistor, a 2-dimensional FET and/or a nanowire transistor, or any suitable device having source/drain regions.

Figure 1B:
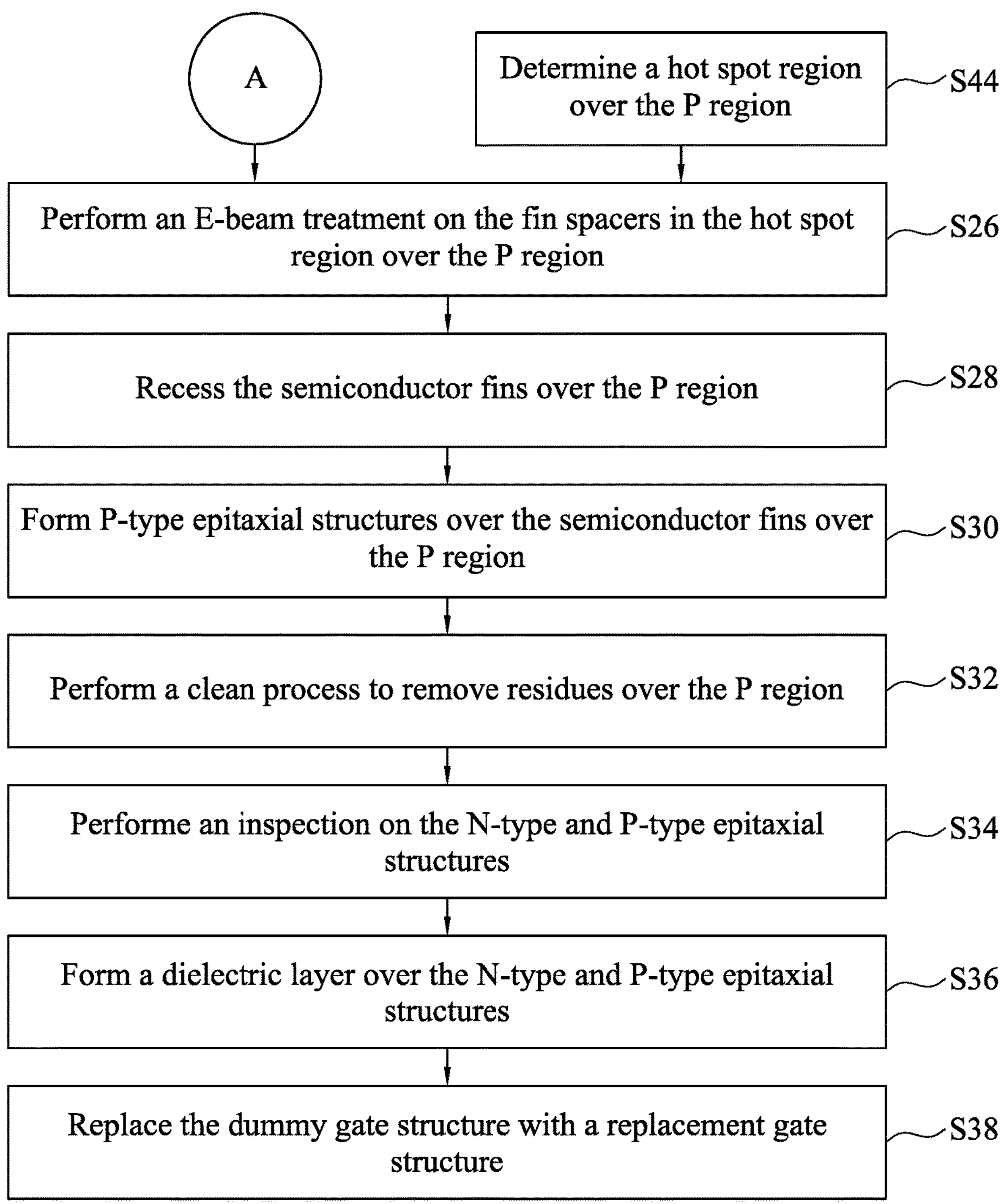

Illustrated in FIGS. 1A and 1B are a method of forming a semiconductor device in accordance with some embodiments of the present disclosure. FIGS. 2A-12C illustrate various processes at various stages of the method of FIGS. 1A and 1B in accordance with some embodiments of the present disclosure. Throughout the various views and illustrative embodiments, like reference numbers are used to designate like elements. In FIGS. 2A-12C, the "A" figures (e.g., FIGS. 2A, 3A, etc.) illustrate a perspective view, the "B" figures (e.g., FIGS. 2B, 3B, etc.) illustrates a cross-sectional view along Y direction corresponding to lines B-B illustrated the "A" figures, and the "C" figures (e.g., FIG. 2C, 3C, etc.) illustrate a cross-sectional view along the X direction corresponding to lines C-C illustrated in in the "A" figures. It is understood that additional operations can be provided before, during, and after the processes shown by FIGS. 2A-12C, and some of the operations described below can be replaced or eliminated, for additional embodiments of the method. The order of the operations/processes may be interchangeable.

Figure 2A:
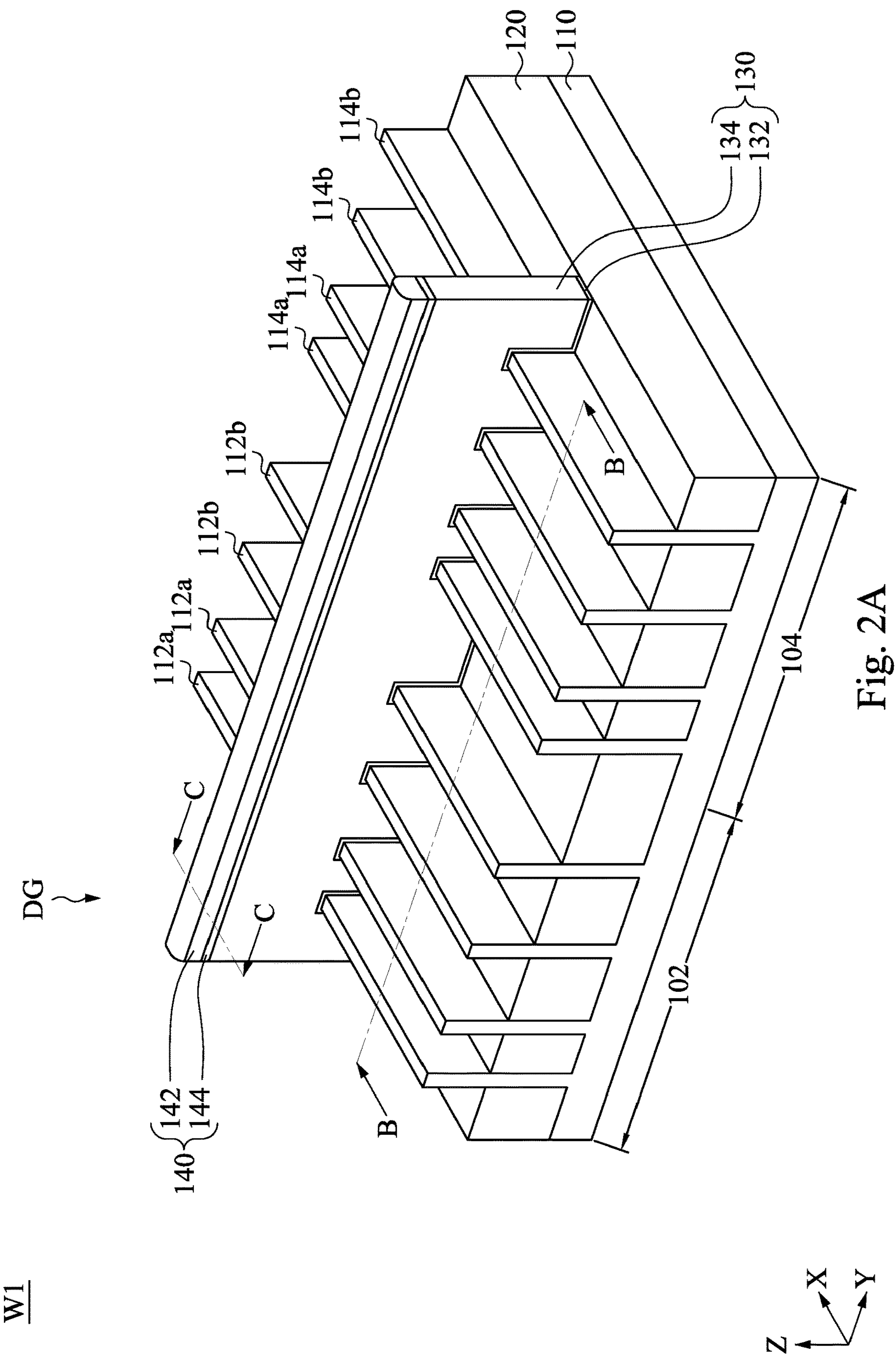
FIGS. 2A, 3A, 4A, 5A, 6A, 7A, 8A, 9A, 10A, 11A, and 12A illustrate perspective views of a semiconductor device at various stages of the method of FIGS. 1A and 1B in accordance with some embodiments of the present disclosure.
Figure 2B:
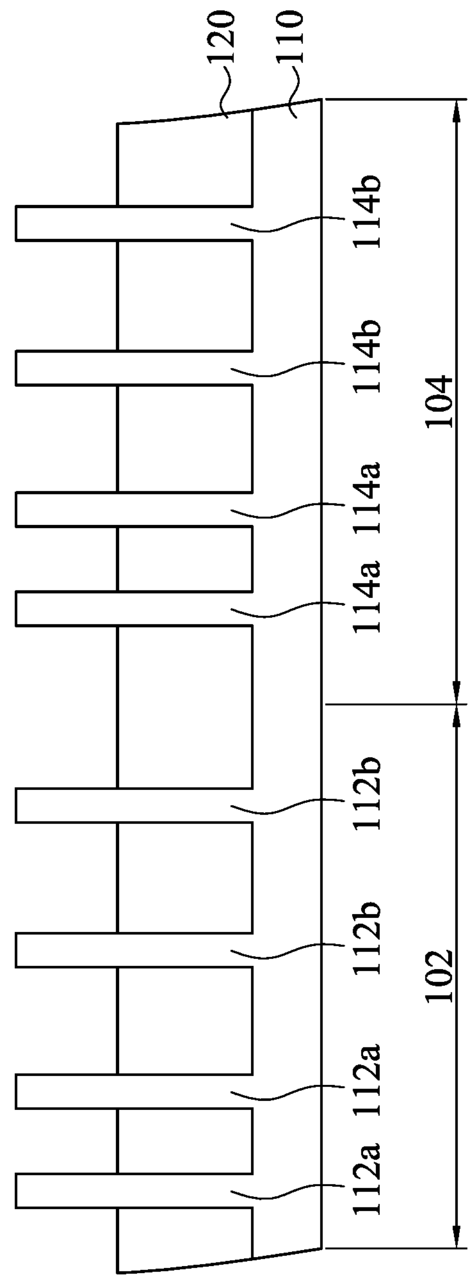
FIGS. 2B, 3B, 4B, 5B, 6B, 7B, 8B, 9B, 10B, 11B, and 12B illustrate cross-sectional view of a semiconductor device at various stages of the method of FIGS. 1A and 1B in accordance with some embodiments of the present disclosure.
Figure 2C:
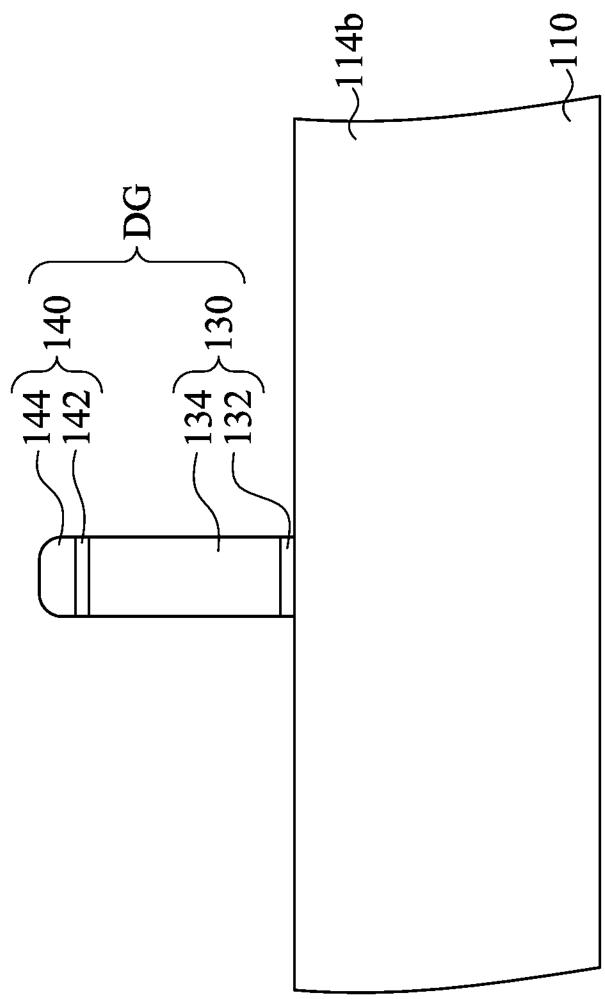
FIGS. 2C, 3C, 4C, 5C, 6C, 7C, 8C, 9C, 10C, 11C, and 12C illustrate another cross-sectional views of a semiconductor device at various stages of the method of FIGS. 1A and 1B in accordance with some embodiments of the present disclosure.

In operation S12 of FIG. 1A, at least one dummy gate structure 130 is formed across semiconductor fins 112*a*, 112*b*, 114*a*, and 114*b*, as shown in FIGS. 2A-2C. For example, there is shown a semiconductor wafer W1 having a substrate 110. The substrate 110 includes at least one N region 102 and at least one P region 104. One or more semiconductor fins 112*a* and 112*b* are formed in the N region 102, and one or more semiconductor fins 114*a* and 114*b* are formed in the P-region 104. The semiconductor fins 112*a* and 112*b* have different conductivity type from the semiconductor fins 114*a* and 114*b*. For example, the semiconductor fins 112*a* and 112*b* are N-type, and the semiconductor fins 114*a* and 114*b* are P-type. It is understood that respectively two semiconductor fins 112*a*, 112*b*, 114*a*, and 114*b* are illustrated for purposes of illustration, but other embodiments may include any number of semiconductor fins. In some embodiments, one or more dummy semiconductor fins are formed adjacent to the semiconductor fins 112*a*, 112*b*, 114*a*, and/or 114*b* for an active FinFET. The semiconductor fins 112*a*, 112*b*, 114*a*, and 114*b* extend in the X direction and protrude from the substrate 110 in the Z direction, while the dummy gate structures 130 extend in the Y direction. In some embodiments, the semiconductor fins 112*a* and 112*b* have substantially the same width, and the semiconductor fins 114*a* and 114*b* have substantially the same width.

The N region 102 and the P region 104 of the substrate 110 may be doped. In some embodiments, the N region 102 may be doped with p-type dopants, and the P region 104 may be doped with n-type dopants. For example, the p-type dopants may be boron or $BF_2$, and the n-type dopants may be phosphorus or arsenic. The N region 102 may be configured for an n-type FinFET, and the P region 104 may be configured for a p-type FinFET.

In some embodiments, the substrate 110 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. Further, the substrate 110 may include an epitaxial layer (epi-layer), which may be strained for performance enhancement, and/or may include a silicon-on-insulator (SOI) structure.

The semiconductor fins 112*a*, 112*b*, 114*a*, and 114*b* may be formed using, for example, a patterning process to form trenches such that trenches are formed between adjacent semiconductor fins 112*a*, 112*b*, 114*a*, and 114*b*. As discussed in greater detail below, the semiconductor fins 112*a*, 112*b*, 114*a*, and 114*b* will be used to form FinFETs.

Isolation structures 120, such as shallow trench isolations (STI), are disposed in the trenches over the substrate 110. The isolation structures 120 can be equivalently referred to as an isolation insulating layer in some embodiments. The isolation structures 120 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation structures 120 are formed through a process such as CVD, flowable CVD (FCVD), or a spin-on-glass process, although any acceptable process may be utilized. Subsequently, portions of the isolation structures 120 extending over the top surfaces of the semiconductor fins 112*a*, 112*b*, 114*a*, and 114*b*, are removed using, for example, an etch back process, chemical mechanical polishing (CMP), or the like.

In some embodiments, the isolation structures 120 are recessed to expose an upper portion of the semiconductor fin 112*a*, 112*b*, 114*a*, and 114*b* as illustrated in FIGS. 2A-2B. In some embodiments, the isolation structures 120 are recessed using a single etch processes, or multiple etch processes. In some embodiments in which the isolation structures 120 is made of silicon oxide, the etch process may be, for example, a dry etch, a chemical etch, or a wet cleaning process. For example, the chemical etch may employ fluorine-containing chemical such as dilute hydrofluoric (dHF) acid.

After the semiconductor fins 112*a*, 112*b*, 114*a*, and 114*b* are formed, the dummy gate structure 130 including a gate dielectric layer 132 and a dummy gate electrode 134 is formed over the exposed semiconductor fins 112*a*, 112*b*, 114*a*, and 114*b*. In some embodiments, the gate dielectric layer 132 and the dummy gate electrode 134 are formed by depositing and patterning a gate dielectric layer formed over the exposed semiconductor fins 112*a*, 112*b*, 114*a*, and 114*b* and a dummy gate electrode layer over the gate dielectric layer. The gate dielectric layer 132 may be formed by thermal oxidation, CVD, sputtering, or other suitable techniques. In some embodiments, the gate dielectric layer 132 may be made of one or more suitable dielectric materials such as silicon oxide, silicon nitride, SiCN, SiON, and SiN, the like, or a combination thereof.

In some embodiments, the dummy gate electrode 134 is a conductive material and may be selected from a group including amorphous silicon, poly silicon, amorphous germanium, poly germanium, amorphous silicon-germanium, poly silicon-germanium, metallic nitrides, metallic silicides, metallic oxides, and metals. The dummy gate electrode 134 may be deposited by PVD, CVD, sputter deposition, or the like. Other materials, conductive and non-conductive, may be used. In certain embodiments, poly-Si is used.

A mask pattern may be formed over the dummy gate electrode layer to aid in the patterning. In some embodiments, a hard mask pattern 140 including a first mask layer 142 and a second mask layer 144 is formed over a blanket layer of polysilicon. The hard mask pattern is made of one or more layers of $SiO_2$, SiCN, SiON, $Al_2O_3$, SiN, or other suitable materials. In certain embodiments, the first mask layer 142 includes silicon nitride (SiN) and the second mask layer 144 includes silicon oxide. By using the mask pattern 140 as an etching mask, the dummy electrode layer is patterned into the dummy gate electrode 134. In some embodiments, the dummy dielectric layer is also patterned to define the gate dielectric layer 132. In some embodiments, the dummy gate structure 130 and the hard mask pattern 140 are together referred to as a dummy gate stack DG.

Figure 3A:
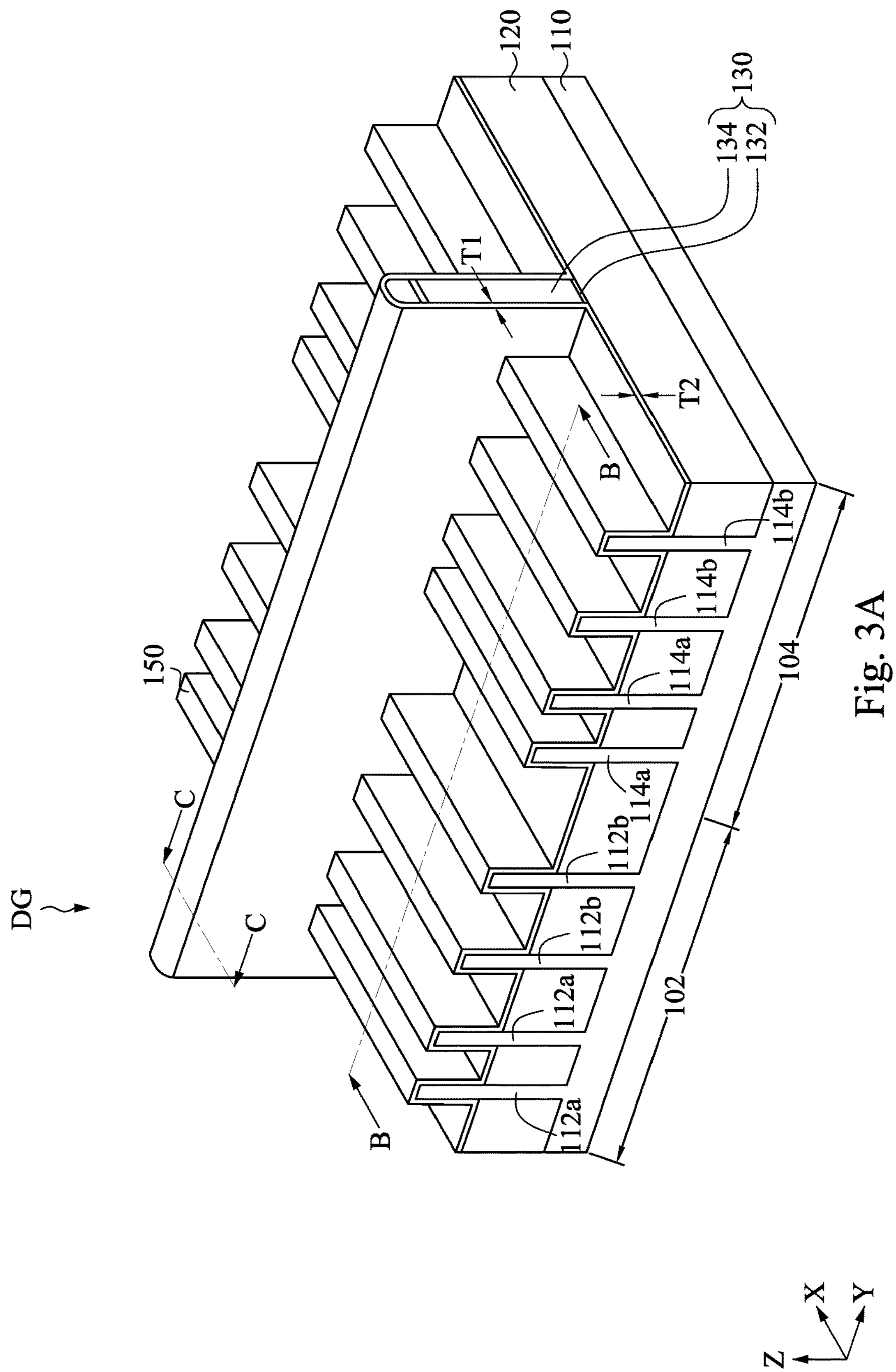
Figure 3B:
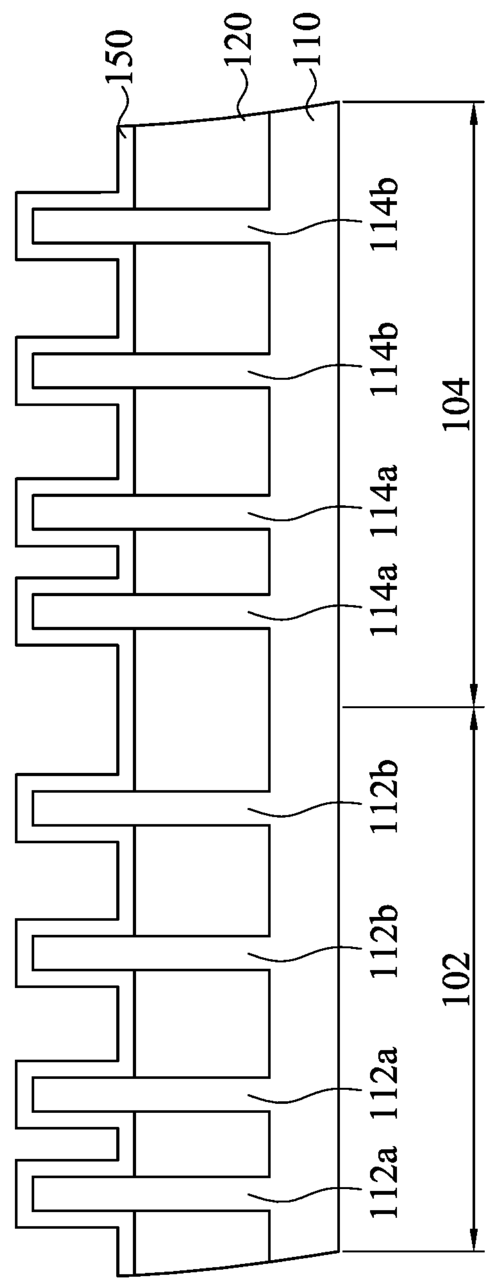
Figure 3C:
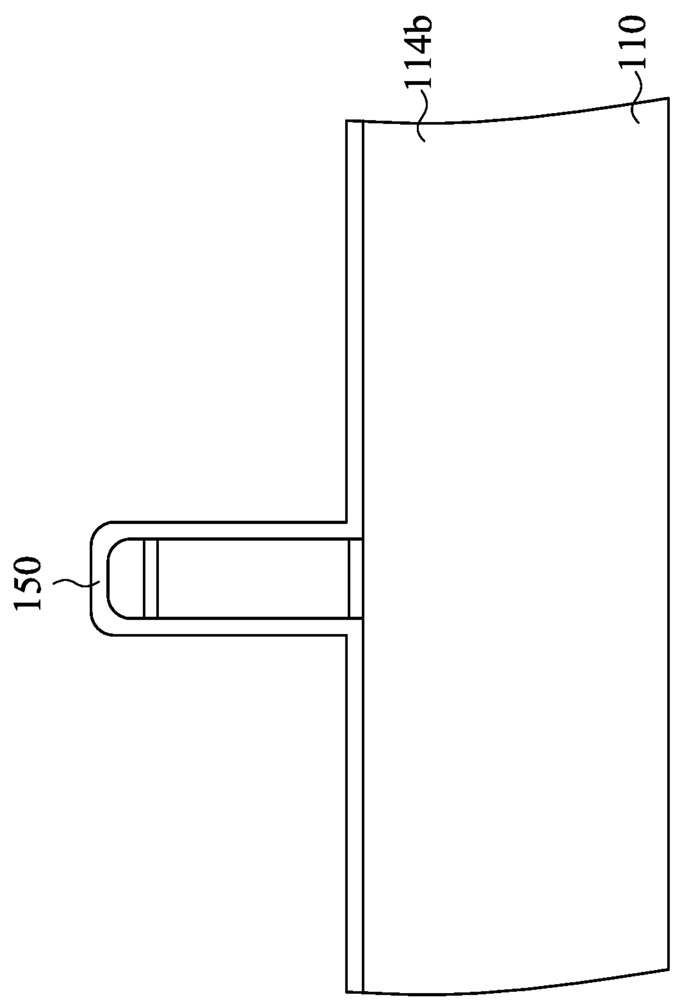

In operation S14 of FIG. 1A, a spacer layer 150 is formed as a blanket layer to cover the structure shown in FIGS. 2A-2C. The resulting structure is illustrated in FIGS. 3A-3C. In some embodiments, the spacer layer 150 is formed of silicon nitride, and may have a single-layer structure. In alternative embodiments, the spacer layer 150 is a composite layer including a plurality of layers. For example, the spacer layer 150 may include a silicon oxide layer, and a silicon nitride layer over the silicon oxide layer. The spacer layer 150 may be formed as a substantially conformal layer, and hence a thickness T1 of the vertical portions of the spacer layer 150 on sidewalls of the semiconductor fins 112*a*, 112*b*, 114*a*, and 114*b* and the dummy gate stack DG is close to a thickness T2 of the horizontal portion of the spacer layer 150. For example, thicknesses T1 and T2 may have a difference smaller than about 20 percent of thickness T2.

Figure 4A:
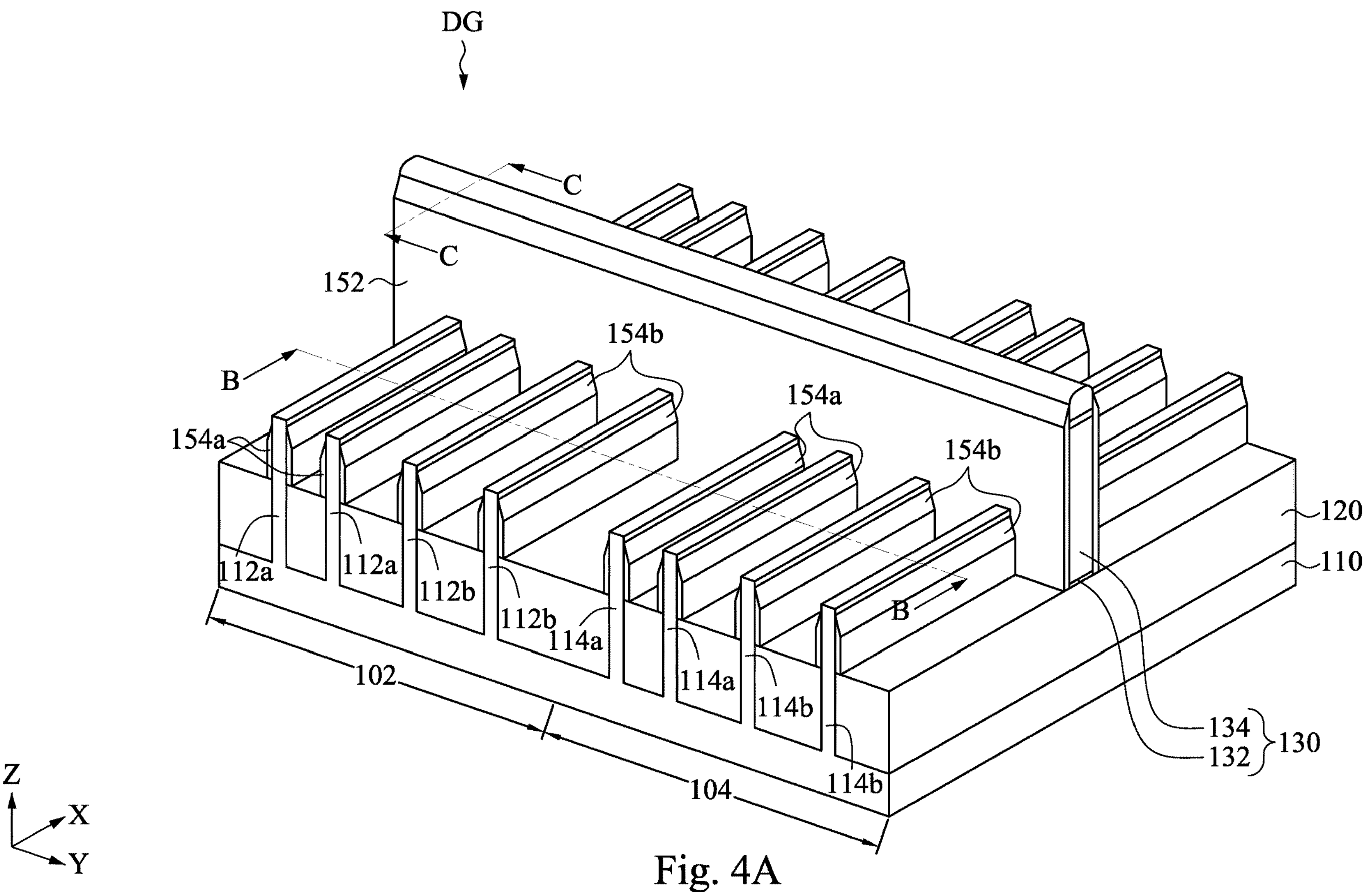
Figure 4B:
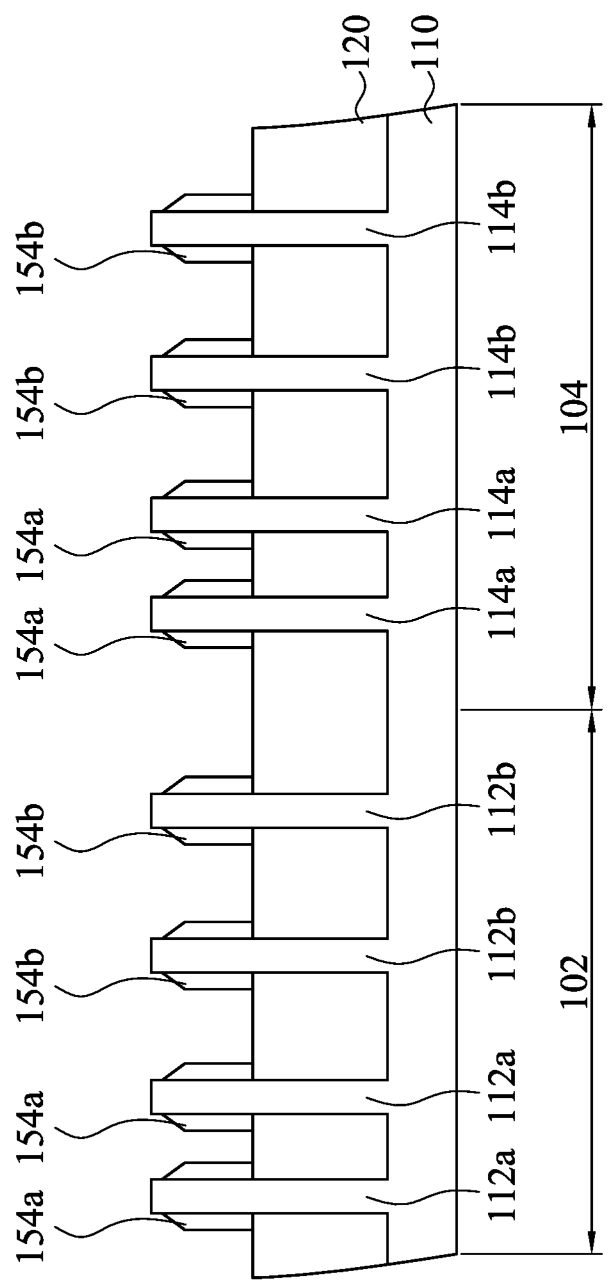
Figure 4C:
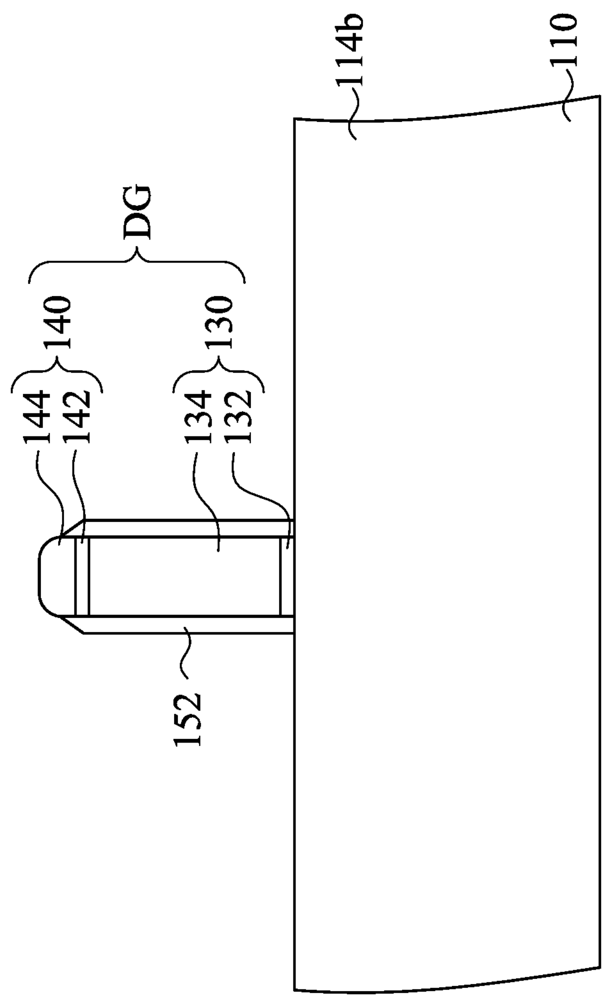

Next, in operation S16 of FIG. 1A, the spacer layer 150 is patterned, forming gate spacers 152 and fin spacers 154*a* and 154*b*, as shown in FIGS. 4A-4C. In some embodiments in which the spacer layer 150 (FIGS. 3A-3C) includes silicon nitride, the patterning of the silicon nitride layer includes a dry etching using $CH_2F_2$ as an etchant. In other embodiments in which the spacer layer 150 (FIGS. 3A-3C) includes a silicon oxide layer and a silicon nitride layer, the patterning of the spacer layer 150 includes a dry etching using $CH_2F_2$ as an etchant to pattern silicon nitride, followed by a dry etching using $CF_4$ as an etchant to pattern the silicon oxide layer. The patterning includes an anisotropic effect, so that the horizontal portions of the spacer layer 150 are removed, while the vertical portions on the sidewalls of the dummy gate structures 130 remain to form gate spacers 152. The vertical portions of the spacer layer 150 on the sidewalls of semiconductor fins 112*a* and 114*a* remain to form fin spacers 154*a*, and the vertical portions of the spacer layer 150 on the sidewalls of semiconductor fins 112*b* and 114*b* remain to form fin spacers 154*b*.

Figure 5A:
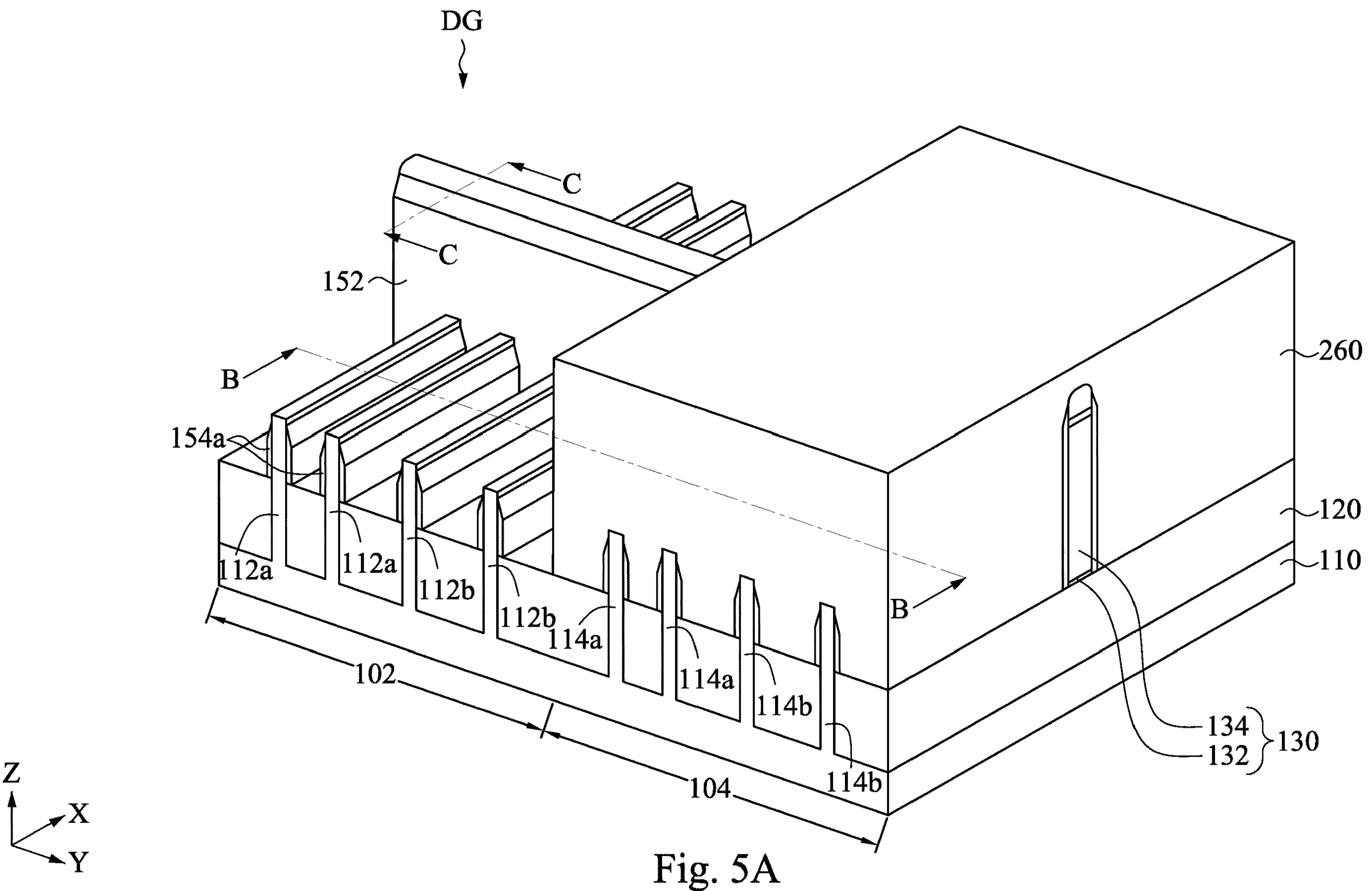
Figure 5B:
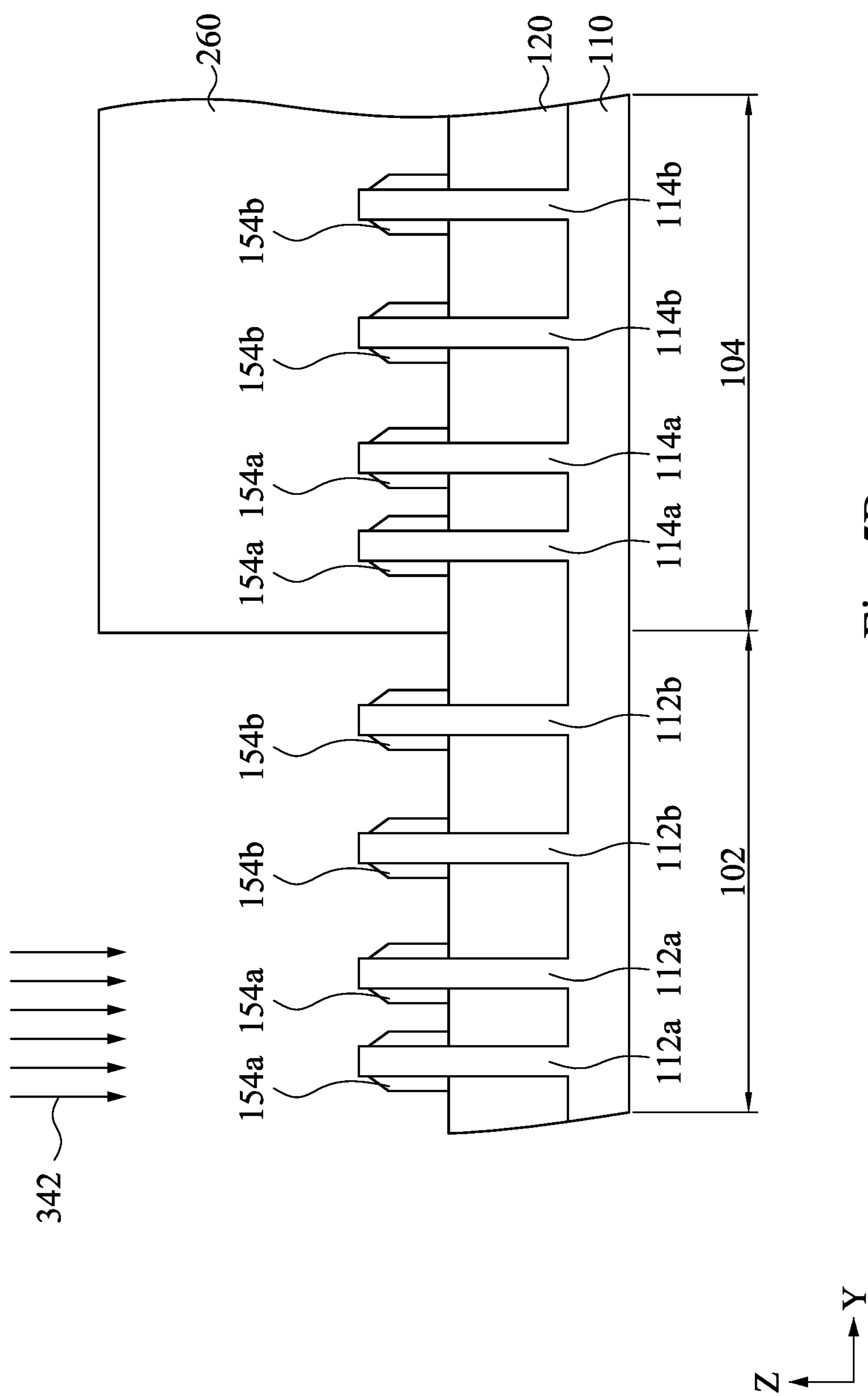
Figure 5C:
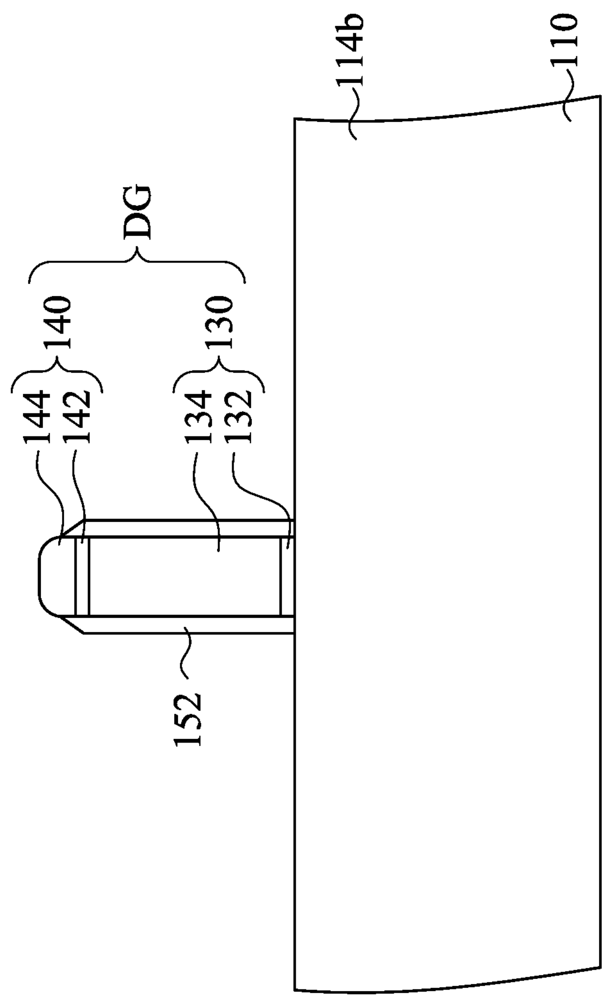
Figure 5D:
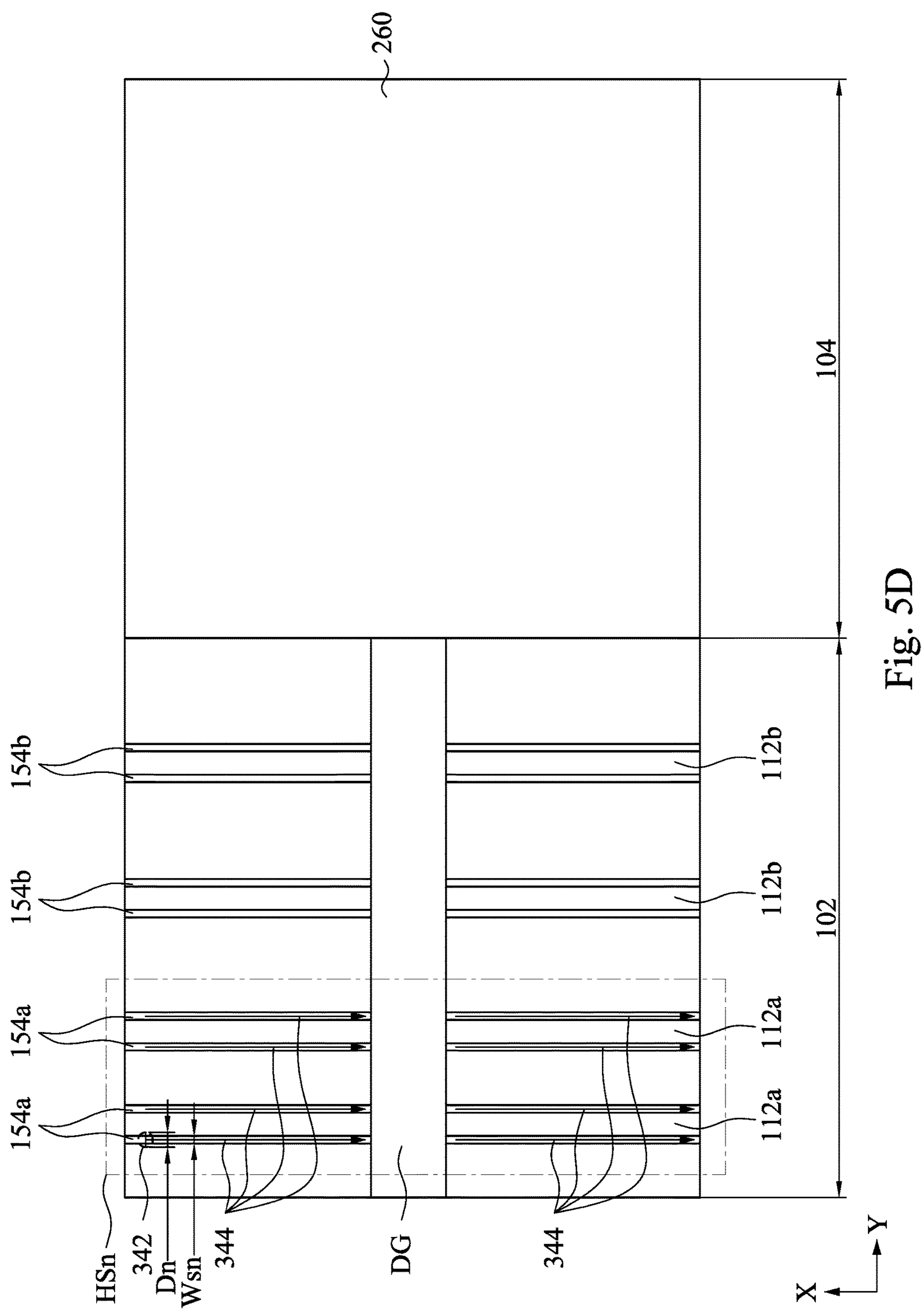
FIG. 5D is a schematic top view of FIG. 5A.

In operation S18 of FIG. 1A, an E-beam treatment is performed on the fin spacers 154*a* adjacent to the semiconductor fins 112*a*, as shown in FIGS. 5A-5D, where FIG. 5D is a schematic top view of FIG. 5A. Specifically, a first mask layer 260 is formed over the P region 104 of the substrate 110 while the N region 102 of the substrate 110 is exposed. That is, the semiconductor fins 112*a* and 112*b* are uncovered by the first mask layer 260 while the semiconductor fins 114*a* and 114*b* are covered by the first mask layer 260.

Then, an E-beam treatment is performed on the fin spacers 154*a* adjacent to the semiconductor fins 112*a*. In some embodiments, a region HSn around the semiconductor fins 112*a* is a hot spot. Hot spots in this context refer to characteristics of the device that prevent the device from performing as desired. Examples of hot spots include pinching, bridging, dishing, erosion, RC delay, metal line thickness variations, Cu residue, and other characteristics that affect the desired device performance. These hot spots can be due to the circuit design and/or the process controls. In this case, the hot spot is the merge of adjacent epitaxial structures (e.g., pull up (PU) transistors merge (PU-PU merge)). That is, the epitaxial structures formed over the semiconductor fins 112*a* may be undesired merged while the epitaxial structures formed over the semiconductor fins 112*b* are separated from each other. In some embodiments, the hot spot region HSn may be determined in advance, as will be discussed in more detail in operation S42 below.

In FIG. 5D, an E-beam 342 is provided to the fin spacers 154*a* to charge the fin spacers 154*a* which is in the hot spot region HSn. In the meanwhile, the fin spacers 154*b* are not performed with the e-beam treatment, and thus the fin spacers 154*b* are not charged. In some embodiments, the e-beam 342 can be tuned to charge specific materials of the fin spacers 154*a*. For example, the wavelength, the energy, and/or other suitable properties of the e-beam 342 can be tuned according to the material of the fin spacers 154*a*. In some embodiments, the wavelength of the e-beam 342 can be in a range from about 0.01 nm to about 10 nm, the energy of the e-beam 342 can be in a range from about 50 eV to about 0.5 keV, and the e-beam 342 can be a laser, and the embodiments of this disclosure is not limited in this respect. If the parameter values are out of the above selected range, the e-beam 342 may not be successfully charge the fin spacers 154*a*.

Specifically, in some embodiments, the energy of the e-beam 342 can be determined according to Moseley's law. Moseley's law is a law concerning the characteristic x-rays that are emitted by atoms. According to Moseley's law, the characteristic X-ray spectra do not display the periodic regularities that are inherent in optical spectra. This indicates that the inner electron shells of the atoms of all elements, which are manifested in the characteristic X-ray spectra, have an analogous structure. The law that the square-root of the frequency of an x-ray spectral line belonging to a particular series is proportional to the difference between the atomic number and a constant which depends on the series. In this embodiment, the energy of the e-beam 342 is substantially proportional to $(Z-1)^2$, where Z is the atomic number of the material of the fin spacers 154*a*. For example, when the fin spacers 154*a* is made of silicon nitride, Z is the atomic number of silicon. The energy of the e-beam 342 is in a range from about 50 eV to about 0.5 keV if the fin spacers 154*a* is made of silicon nitride. The fin spacers 154*a* would not absorb the energy of the e-beam 342 if the energy is out of the range from about 50 eV to about 0.5 keV. Thus, the fin spacers 154*a* can not be charged.

In FIG. 5D, the fin spacer 154*a* has a width Wsn, and the e-beam 342 has a beam size (diameter) Dn in a range of about 0.5 Wsn to about 1.5 Wsn. If the beam size Dn is smaller than 0.5 Wsn, the e-beam 342 may not successfully charge the fin spacers 154*a*; if the beam size Dn is greater than 1.5 Wsn, the e-beam 342 may undesirably charge other elements. Further, the e-beam 342 moves along a direction 344 that is substantially parallel to the extension direction of the fin spacers 154*a* (i.e., the extension direction of the semiconductor fin 112*a*) to charge the fin spacer 154*a* from one end to another end. In some embodiments, the e-beam 342 charges the fin spacers 154*a* one by one. After the e-beam treatment, the fin spacers 154*a* are negative charged, and the fin spacers 154*b* are substantially neutral.

Figure 13:
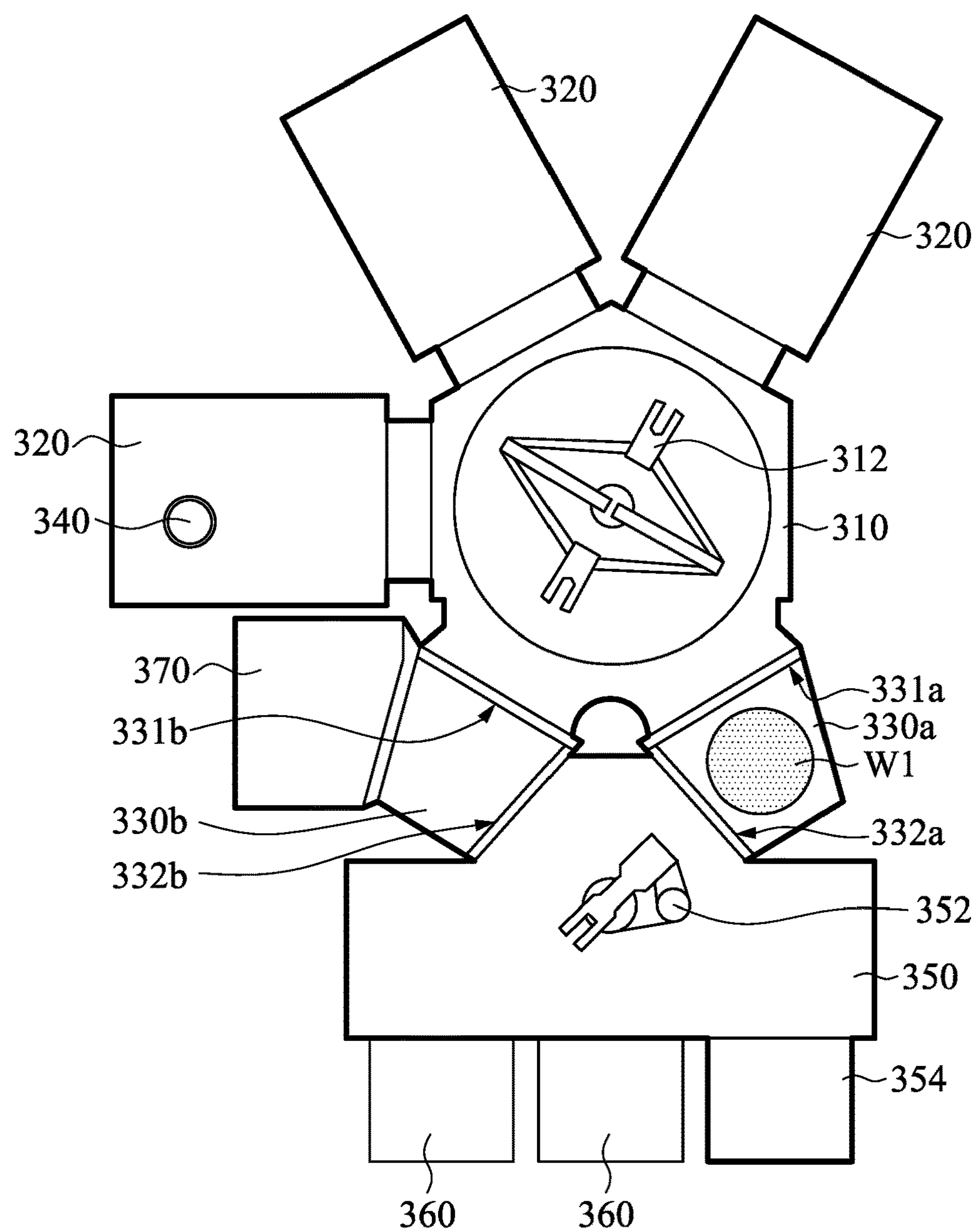
FIG. 13 is a schematic plan view of a cluster tool that may be utilized to perform the e-beam treatment in accordance with some embodiments of the present disclosure.

FIG. 13 is a schematic plan view of a cluster tool 300 that may be utilized to perform the E-beam treatment in accordance with some embodiments of the present disclosure. The cluster tool 300 includes a polyhedral transfer chamber 310, at least one processing chamber 320, at least one load lock chamber, and at least one electron beam (e-beam) source 340. For example, in FIG. 13, the cluster tool 300 includes the polyhedral transfer chamber 310, three of the processing chambers 320, two of the load lock chambers 330*a* and 330*b*, and the e-beam source 340. The polyhedral transfer chamber 310 includes a central transfer mechanism 312 which performs the physical transfer of the wafer W1. The polyhedral transfer chamber 310 is connected to the processing chambers 320 and the load lock chambers 330*a* and 330*b*. This configuration allows the central transfer mechanism 310 to transport at least one wafer W1 between the processing chambers 320 and the load lock chambers 330*a* and 330*b*. In some embodiments, a plurality of the wafers W1 can be transported in the cluster tool 300.

The processing chamber 320 may be configured to perform a manufacturing procedure on the wafer W1. Wafer manufacturing procedures include deposition processes such as physical vapor deposition (PVD), chemical vapor deposition (CVD), plasma-enhanced chemical vapor deposition (PECVD), electrochemical deposition (ECD), molecular beam epitaxy (MBE), atomic layer deposition (ALD) and/or other deposition processes; etching processes including wet and dry etching and ion beam milling; lithographic exposure; ion implantation; thermal processes such as annealing and/or thermal oxidation; cleaning processes such as rinsing and/or plasma ashing; chemical mechanical polishing or chemical mechanical planarizing (CMP) processes; testing; other procedure involved in the processing of the wafer W1; and/or any combination of procedures. In some embodiments, the processing chambers 320 in FIG. 13 may be configured to perform the same or different manufacturing procedure(s) on the wafer W1 according to real situations.

The area of the cluster tool 300 defined by the polyhedral transfer chamber 310 and the processing chambers 320 is sealed. Atmospheric controls, including filtering, provide an environment with extremely low levels of particulates and airborne molecular contamination (AMC), both of which may damage the wafer W1. By creating a microenvironment within the cluster tool 300, the processing chambers 320 can be operated in a cleaner environment than the surrounding facilities. This allows tighter control of contaminates during wafer processing at reduced cost.

The cluster tool 300 further includes an equipment front end module (EFEM) 350. The load lock chambers 330*a* and 330*b* preserve the atmosphere within the polyhedral transfer chamber 310 and processing chambers 320 by separating them from the EFEM 350. That is, the polyhedral transfer chamber 310 is connected to the EFEM 350 through the load lock chambers 330*a* and 330*b*. The load lock chamber 330*a* includes two doors, a polyhedral transfer chamber door 331*a* and a load lock door 332*a*, and the load lock chamber 330*b* includes two doors, a polyhedral transfer chamber door 331*b* and a load lock door 332*b*. The wafer W1 is inserted into the load lock chamber 330*a* and both doors are sealed. The load lock chamber 330*a* is capable of creating an atmosphere compatible with the EFEM 350 or the polyhedral transfer chamber 310 depending on where the loaded wafer W1 is scheduled to be next. This may alters the gas content of the load lock chamber 330*a* by such mechanisms as adding purified gases or creating a vacuum, along with other suitable means for adjusting the load lock chamber atmosphere. When the desired atmosphere has been reached, the corresponding door may be opened, and the wafer W1 can be accessed.

The EFEM 350 provides a closed environment in which to transfer the wafer W1 into and out of the cluster tool 300. The EFEM 350 includes a load lock mechanism 352 which performs the physical transfer of the wafer W1. The wafer W1 is loaded through a load port 354. In FIG. 13, the wafer W1 arrives at the load port 354 contained in a transport carrier 360 such as a front-opening unified pod ("FOUP"), a front-opening shipping box ("FOSB"), a standard mechanical interface ("SMIF") pod, and/or other suitable container. The transport carrier 360 is a magazine for holding one or more wafers W1 and for transporting wafers W1 between manufacturing tools. In some embodiments, the transport carrier 360 may have features such as coupling locations and electronic tags to facilitate use with an automated materials handling system. The transport carrier 360 is sealed in order to provide a microenvironment for the wafer W1 contained within and to protect the wafer W1 and the cluster tool 300 against contamination. To prevent loss of the controlled atmosphere, the transport carrier 360 may have a door designed such that the transport carrier 360 remains sealed until it is docked with the load port 354.

The e-beam source 340 is configured to perform the e-beam treatment to the wafer W1 after the wafer W1 is performed the patterning process of the spacer layer 154*a*. In greater details, the e-beam source 340 is configured to charge the spacer layers 154*a* as mentioned above. As such, the profiles of the epitaxial structures formed thereon can be tuned/adjusted.

In FIG. 13, the e-beam source 340 can be an e-beam gun and is disposed in one of the processing chamber 320. For example, one of the processing chambers 320 is an etching chamber for patterning the spacer layer 150, and the e-beam source 340 is disposed in the etching chamber. However, in some other embodiments, the processing chamber 320 can be some other suitable chamber, such as a chamber for depositing the spacer layer 150. That is, the e-beam source 340 can be disposed in the chambers mentioned above.

In FIG. 13, the e-beam source 340 is disposed in the processing chamber 320, and the processing chamber 320 is configured for patterning the spacer layer 150 or for recessing the semiconductor fins 112*a* and 112*b* which will be described in detail in operation 110. That is, the e-beam treatment and the patterning process of the spacer layer 150 (or the recessing process of the semiconductor fins 112*a* and 112*b*) are in-situ performed. Herein, the term "in-situ" means that the e-beam treatment is performed in the processing chamber 320 where the spacer layer 150 is patterned or where the semiconductor fins 112*a* and 112*b* are recessed, without breaking vacuum.

Figure 14:
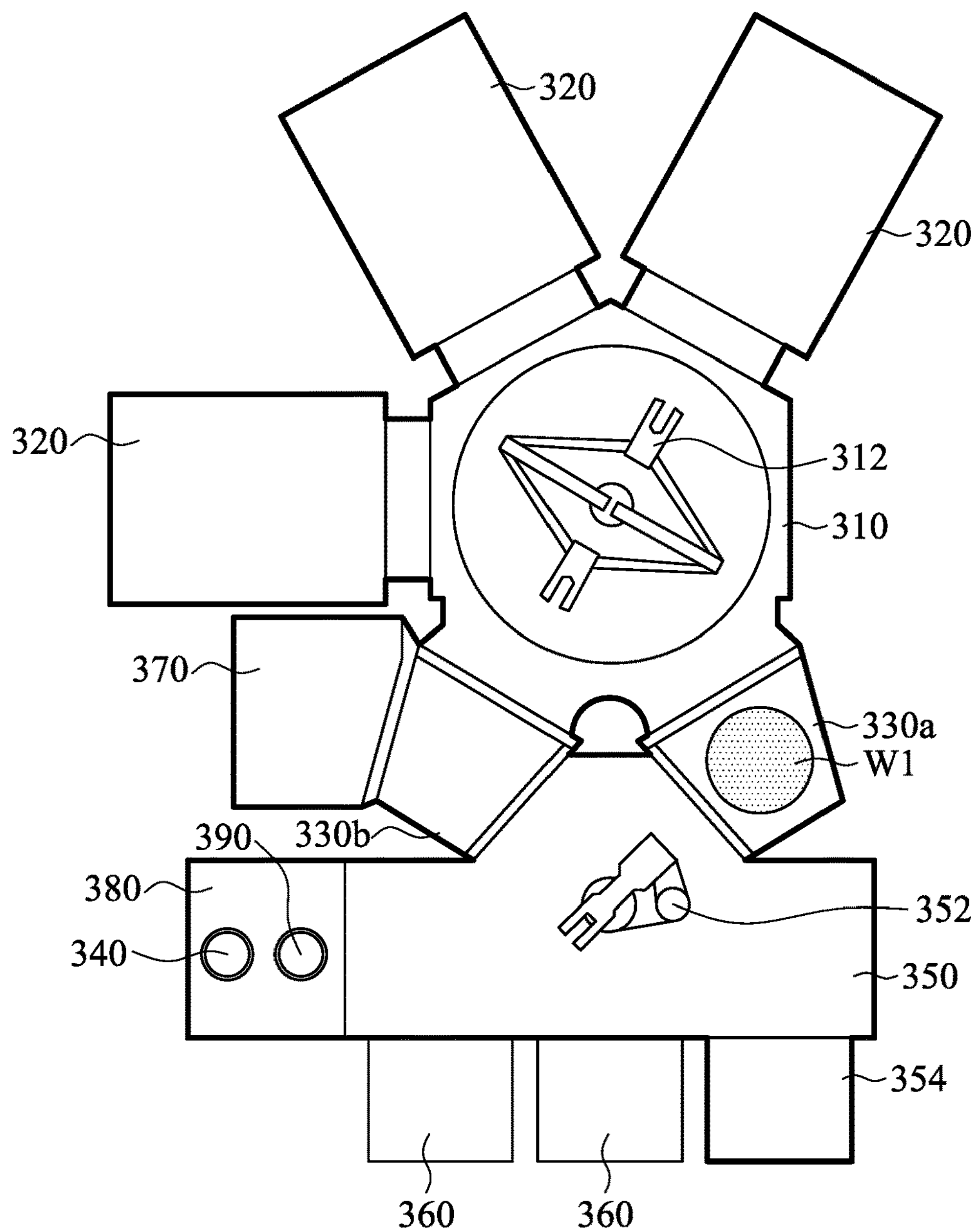
FIG. 14 is a schematic plan view of a cluster tool in accordance with some embodiments of the present disclosure.
Figure 15:
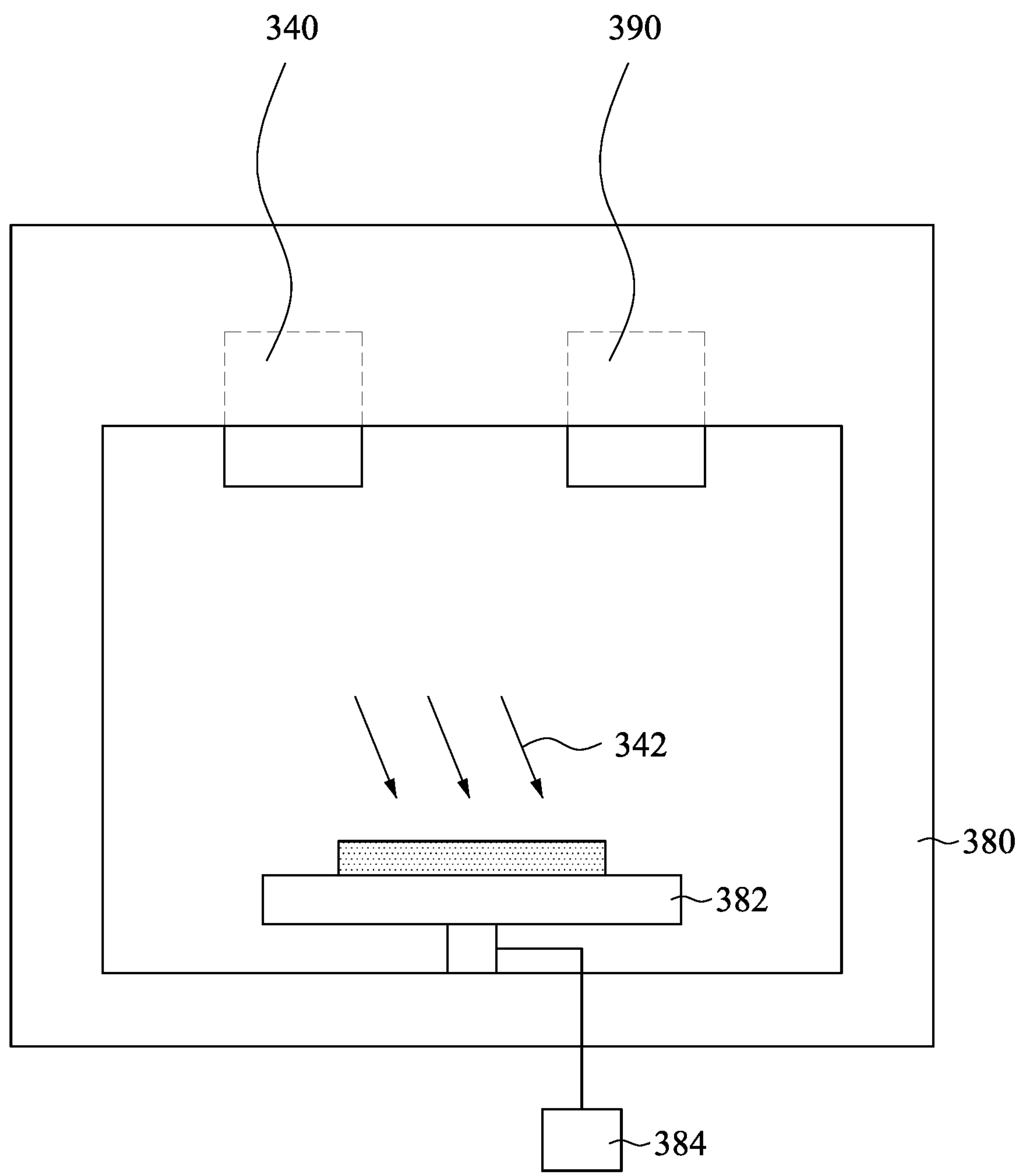
FIG. 15 is a cross-sectional view of an e-beam chamber of FIG. 14.

Although the operations S16-S18 can be in-situ performed, the operations S16-S18 can be ex-situ performed in some other embodiments. Herein, the term "ex-situ" means that the e-beam treatment is performed in a chamber different from the process chamber 320 where the spacer layer 150 is patterned. FIG. 14 is a schematic plan view of a cluster tool 300 in accordance with some embodiments of the present disclosure, and FIG. 15 is a cross-sectional view of an e-beam chamber 380 of FIG. 14. In FIG. 14, the cluster tool 300 further includes an e-beam chamber 380 disposed in the EFEM 350. The e-beam source 340 is disposed in the e-beam chamber 380 instead of in the processing chamber 320. That is, the e-beam source 340 is separated from the processing chamber 320. As such, the wafer W1 undergoes the manufacturing procedure and the e-beam treatment in different chambers. The wafer W1 may be disposed in the e-beam chamber 380 to process the e-beam treatment. For example, the wafer W1 may be disposed on a supporting plate 382 of the e-beam chamber 380, and the e-beam source 340 is disposed above the supporting plate 382. The e-beam source 340 can normally or obliquely provide the e-beam 342 to the wafer W1. In some embodiments, the e-beam chamber 380 further includes a translation mechanism 384, such as an XYZ stage, configured to shift the supporting plate 382.

In some embodiments, the cluster tool 300 further includes a measurement apparatus 390 disposed in the e-beam chamber 380. In some embodiments, the measurement apparatus 390 may be an optical microscope, which is configured to measure the profile of the wafer W1 or perform a defect scanning process on the wafer W1. That is, the e-beam chamber 380 can be a multi-functional chamber.

Figure 6A:
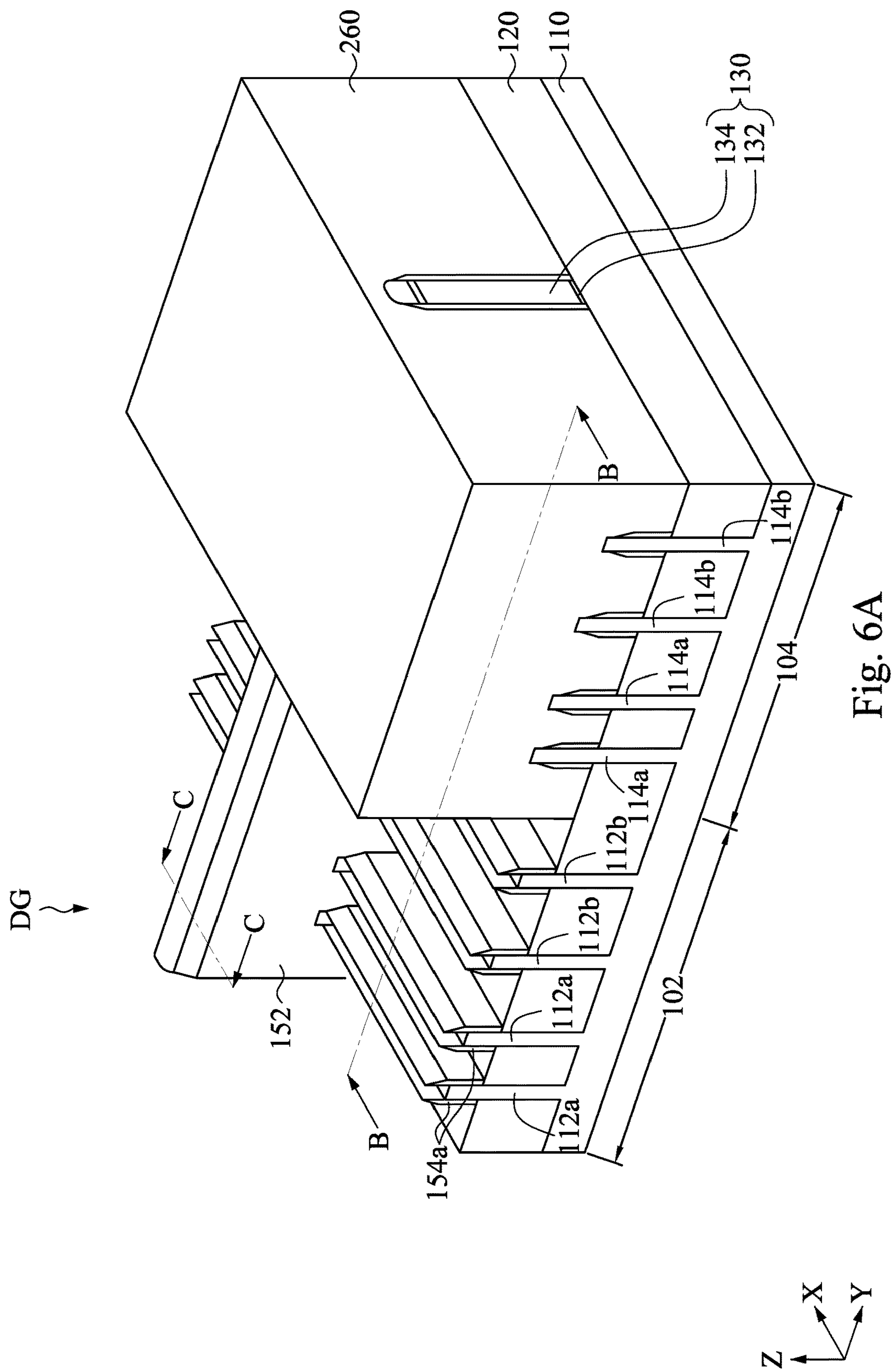
Figure 6B:
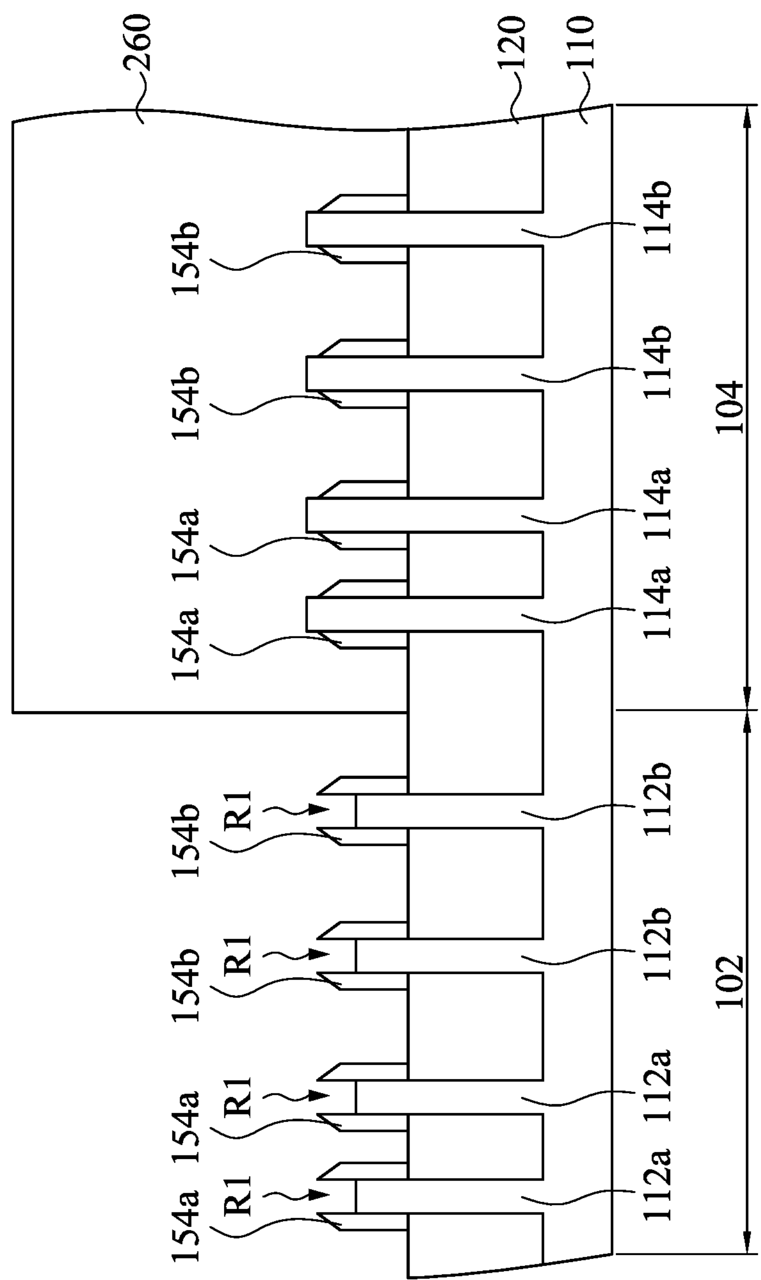
Figure 6C:
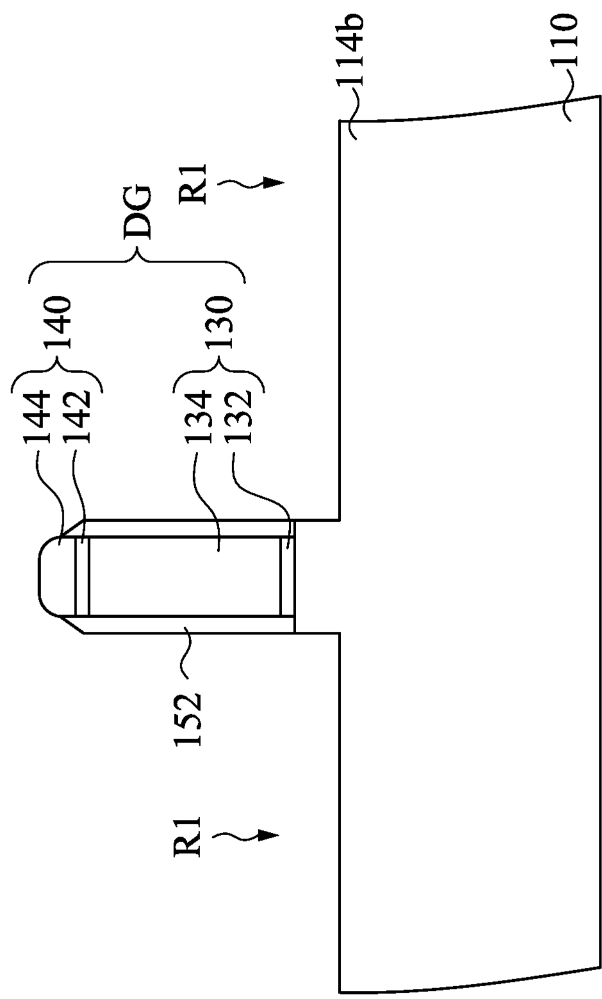

In operation S20 of FIG. 1A, the semiconductor fins 112*a* and 112*b* are recessed, as shown in FIGS. 6A-6C. Portions of the semiconductor fins 112*a* and 112*b* exposed both by the dummy gate stacks DG and the gate spacers 152 are partially removed (or partially recessed) to form recesses R1 in the semiconductor fins 112*a* and 112*b*. In FIGS. 6A-6C, the recesses R1 are formed with the fin spacers 154*a* and 154*b* as their upper portion, where e-beam treatment is performed on the fin spacers 154*a* and not on the fin spacers 154*b*. In some embodiments, the recesses R1 in the semiconductor fins 112*a* and 112*b* have the same depth.

The recessing process may include dry etching process, wet etching process, and/or combination thereof. The recessing process may also include a selective wet etch or a selective dry etch. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 7A:
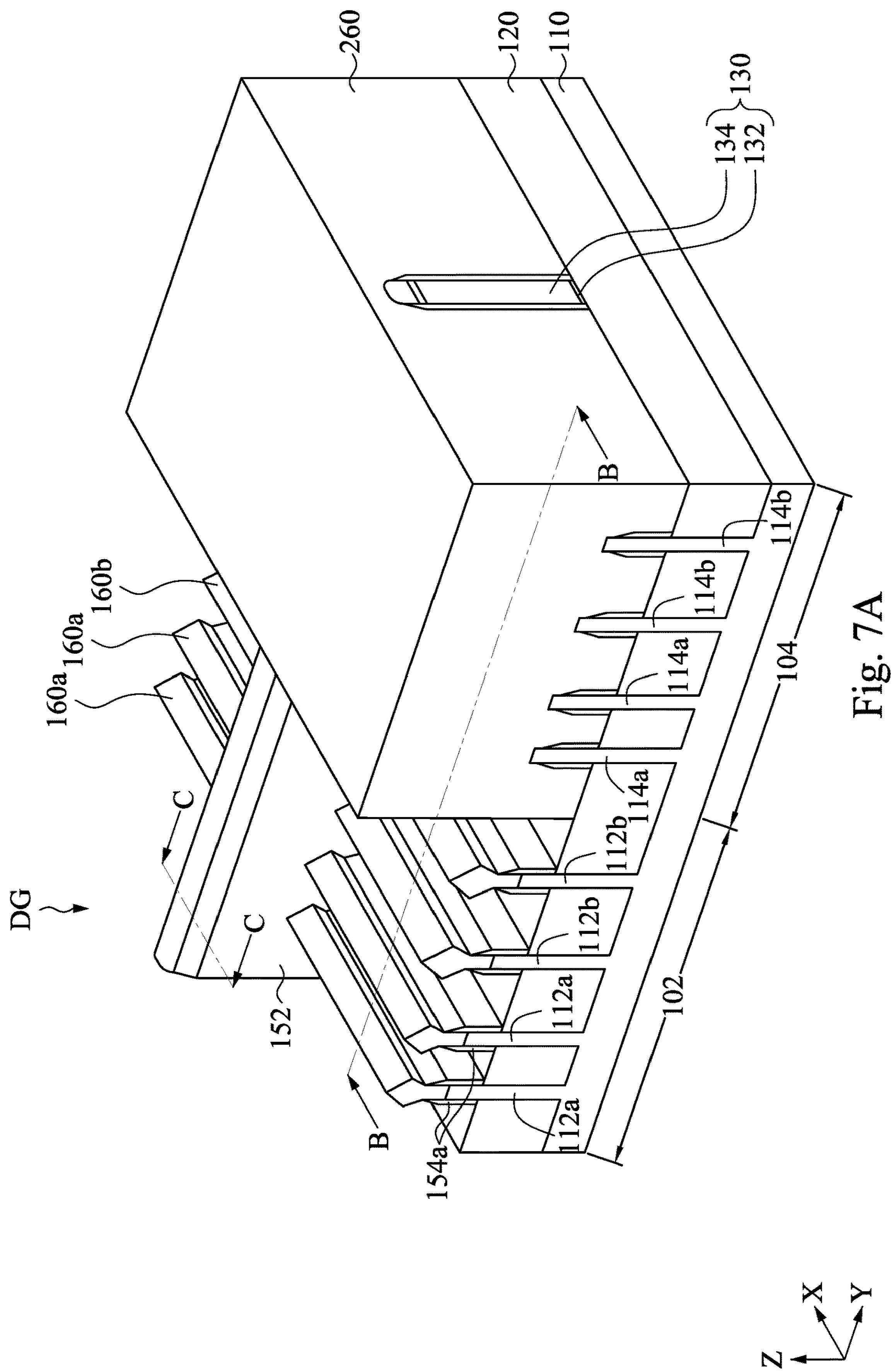
Figure 7B:
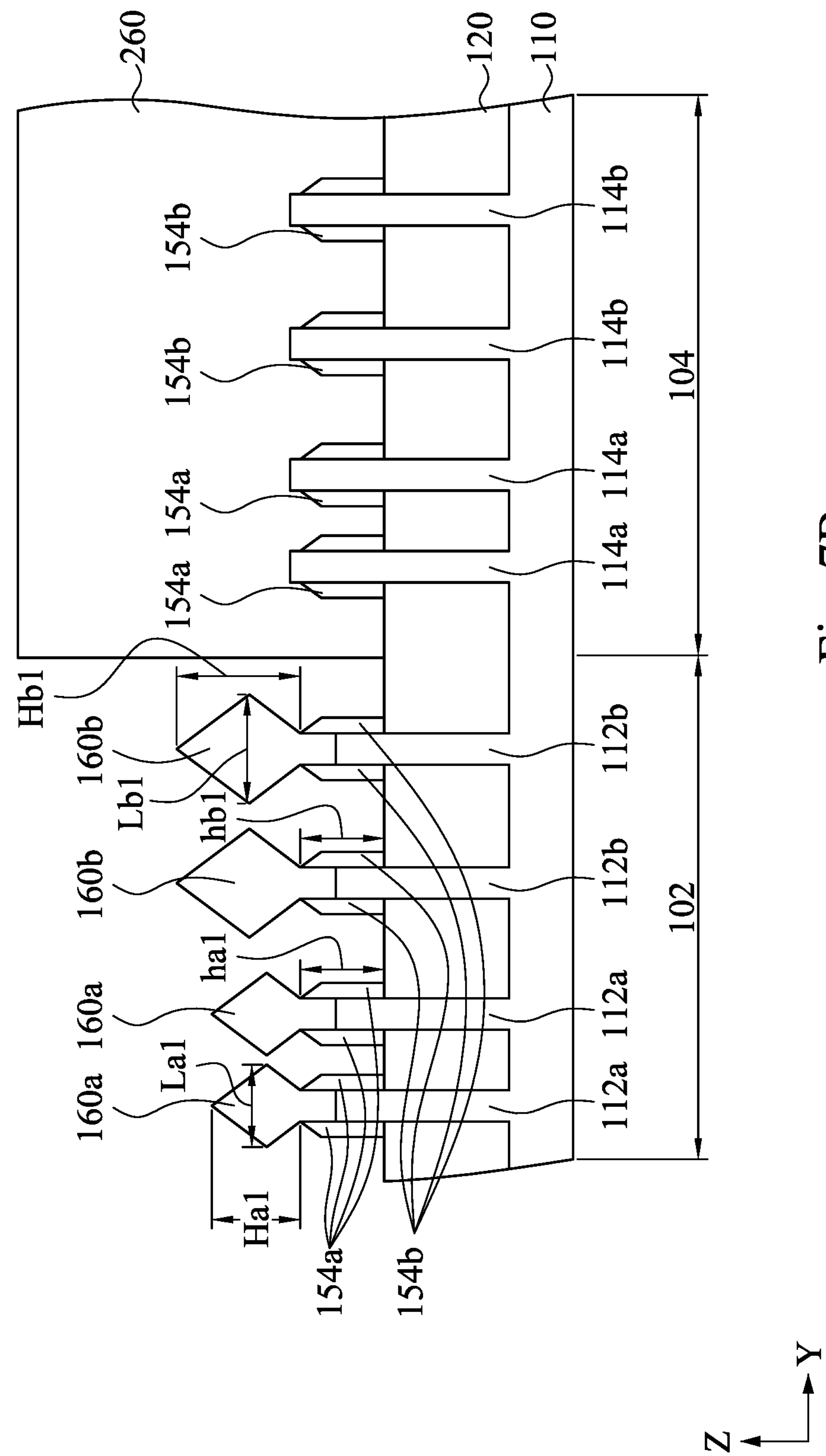
Figure 7C:
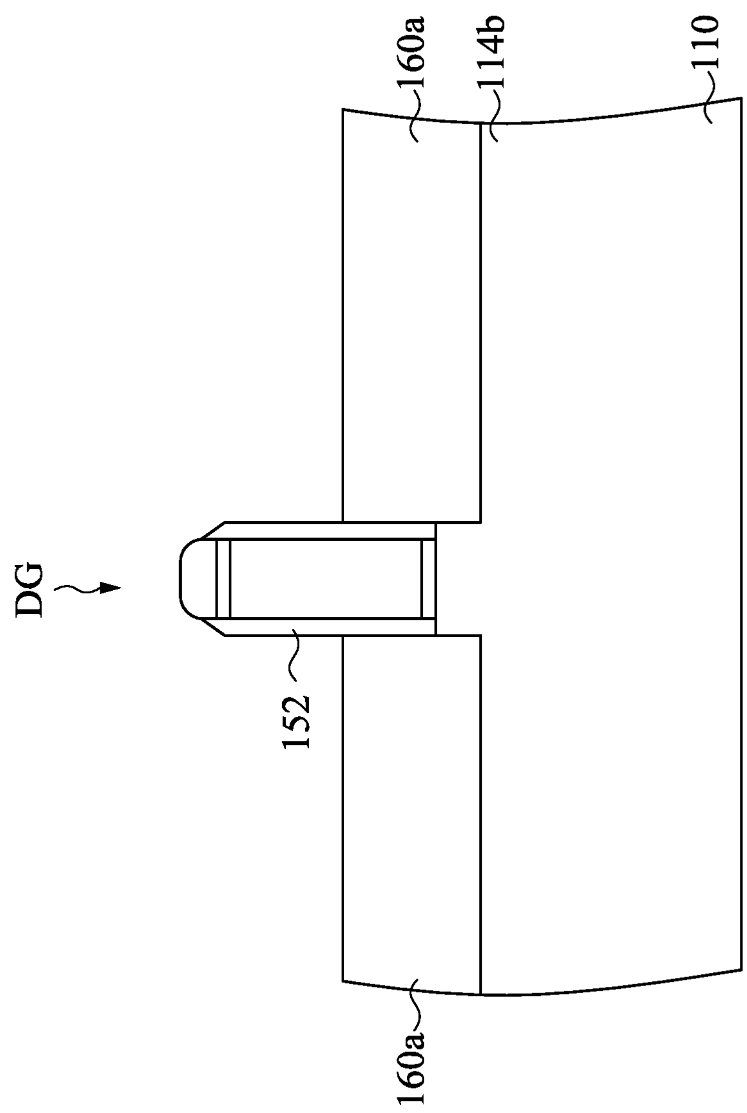

In operation S22, N-type epitaxial structures 160*a* and 160*b* are respectively formed in the recesses R1 and respectively over portions of the semiconductor fins 112*a* and 112*b* uncovered by the dummy gate stacks DG and the gate spacers 152, as illustrated in FIGS. 7A-7C. The N-type epitaxial structures 160*a* and 160*b* are formed by performing, for example, a selectively growing process. The N-type epitaxial structures 160*a* and 160*b* have suitable crystallographic orientations (e.g., a (100), (110), or (111) crystallographic orientation). In some embodiments, the N-type epitaxial structures 160*a* and 160*b* both have facets, and the crystallographic orientations of the facets of the N-type epitaxial structures 160*a* and 160*b* are the same. In some embodiments, the N-type epitaxial structures 160*a* and 160*b* may include an epitaxially growing silicon phosphorus (SiP) or silicon carbon (SiC). The epitaxial processes include CVD deposition techniques (e.g., vapor-phase epitaxy (VPE) and/or ultra-high vacuum CVD (UHV-CVD)), molecular beam epitaxy, and/or other suitable processes.

In FIG. 7B, the N-type epitaxial structures 160*a* and 160*b* have different sizes. Specifically, since the fin spacers 154*a* are negatively charged, the materials (mostly are positively charged) for growing the N-type epitaxial structures 160*a* are biased by the fin spacers 154*a* and thus hard to formed over the semiconductor fins 112*a* (and over the fin spacers 154*a*). In other words, the growth of the N-type epitaxial structures 160*a* is suppressed by the fin spacers 154*a*. In contrary, since the fin spacers 154*b* are not charged, the growth of the N-type epitaxial structures 160*b* is not suppressed. That is, the growth rate of the N-type epitaxial structures 160*b* is greater than the growth rate of the N-type epitaxial structures 160*a*.

In some embodiments, since the negative charges in the fin spacers 154*a* are discharged as time goes on, the queue time (Q-time) between operations S18 to S22 may be shorter than about 1 day, or shorter than about 12 hours. If the Q-time is longer than about 1 day, the fin spacers 154*a* may not suppress the growth of the N-type epitaxial structures 160*a*.

In FIG. 7B, since the fin spacers 154*a* and 154*b* are formed together, the height ha1 of the fin spacers 154*a* is substantially the same as the height hb1 of the fin spacers 154*b*. However, since the N-type epitaxial structures 160*b* grow faster than the N-type epitaxial structures 160*a*, the height Ha1 of the N-type epitaxial structures 160*a* is less than the height Hb1 of the N-type epitaxial structures 160*b*, and the lateral width La1 of the N-type epitaxial structures 160*a* is less than the lateral width Lb1 of the N-type epitaxial structures 160*b*. In other words, the N-type epitaxial structures 160*a* and 160*b* have similar shapes but with different sizes. As such, the e-beam treatment prevents the N-type epitaxial structures 160*a* from being merged.

Figure 8A:
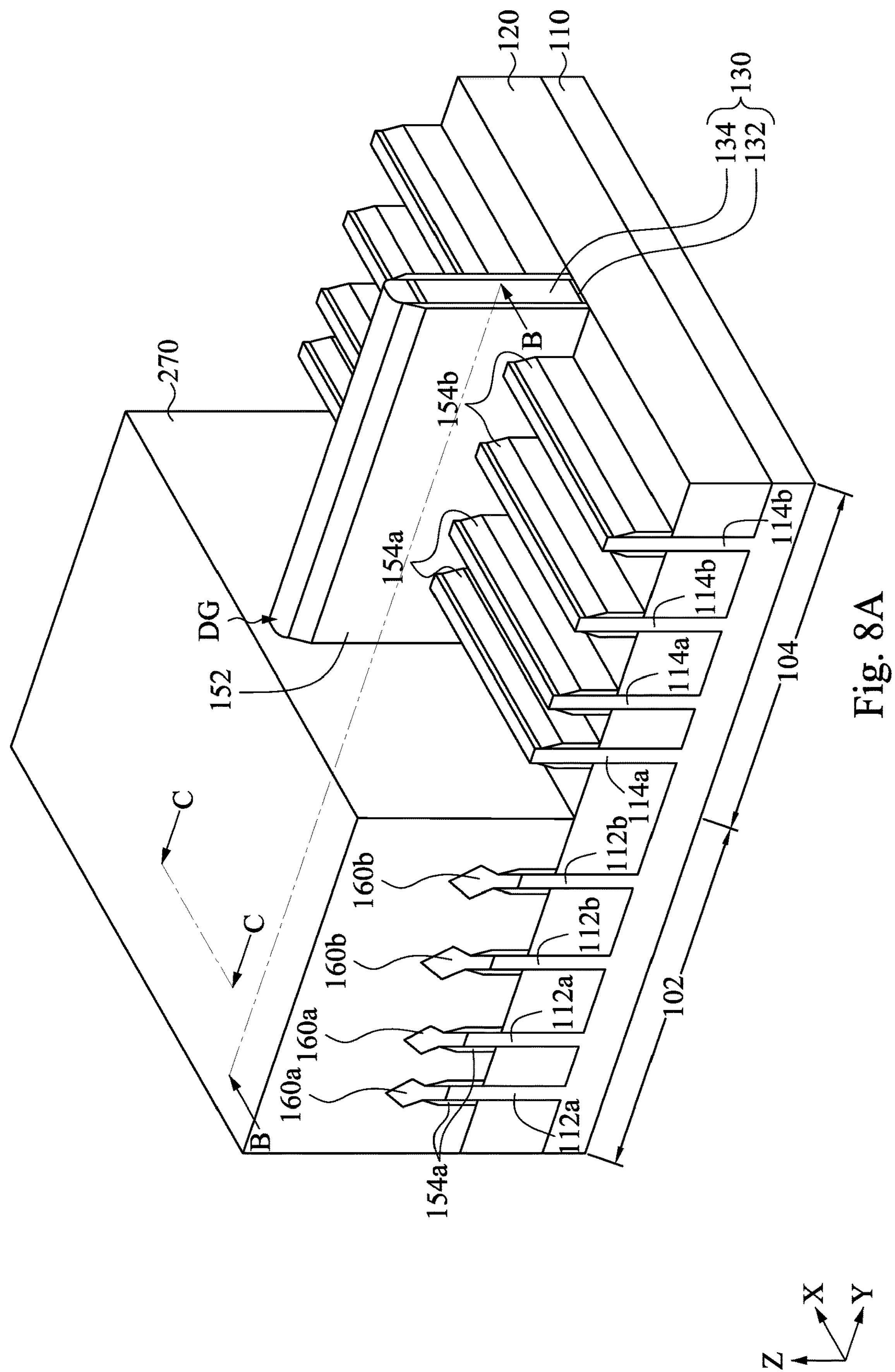
Figure 8B:
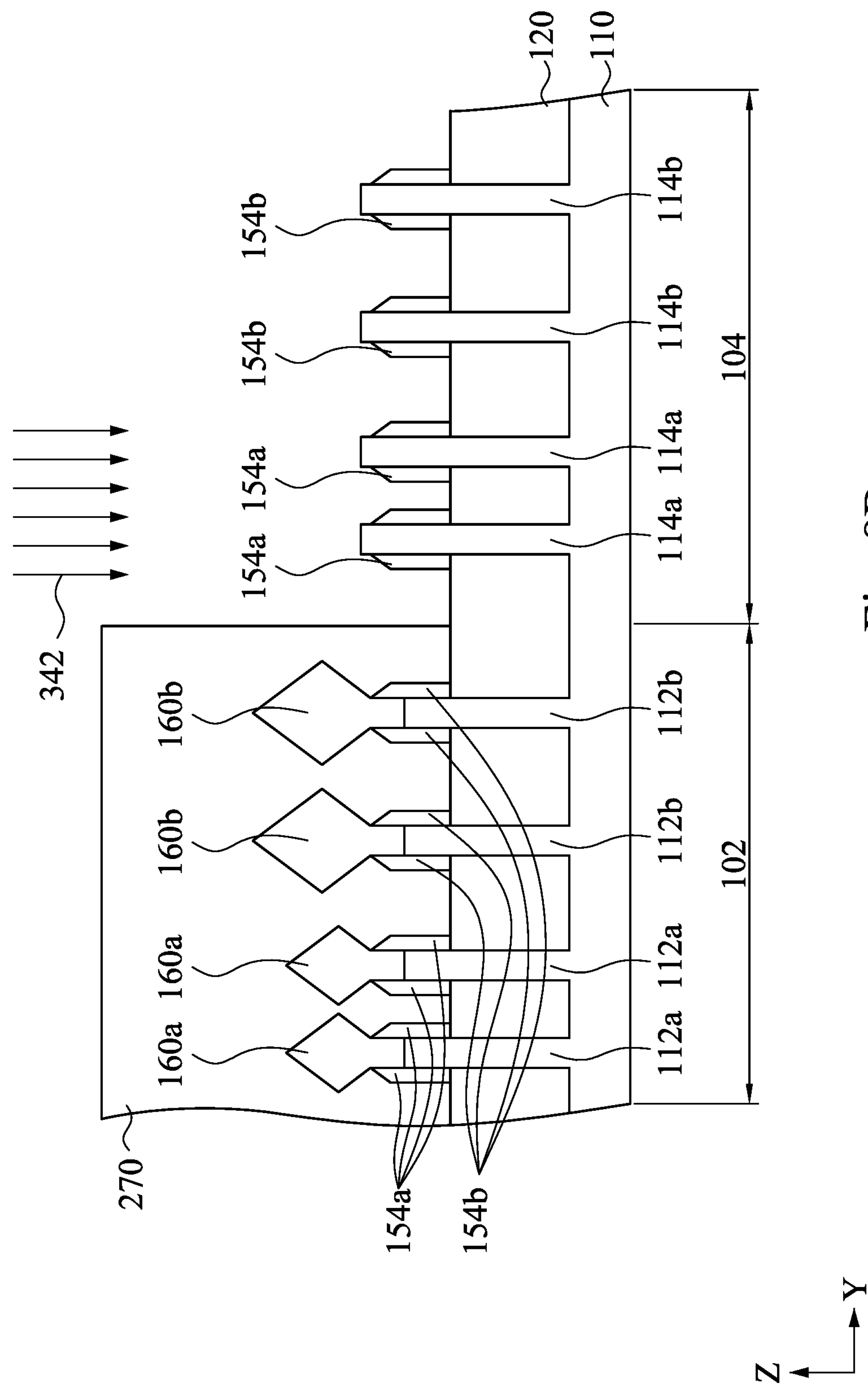
Figure 8C:
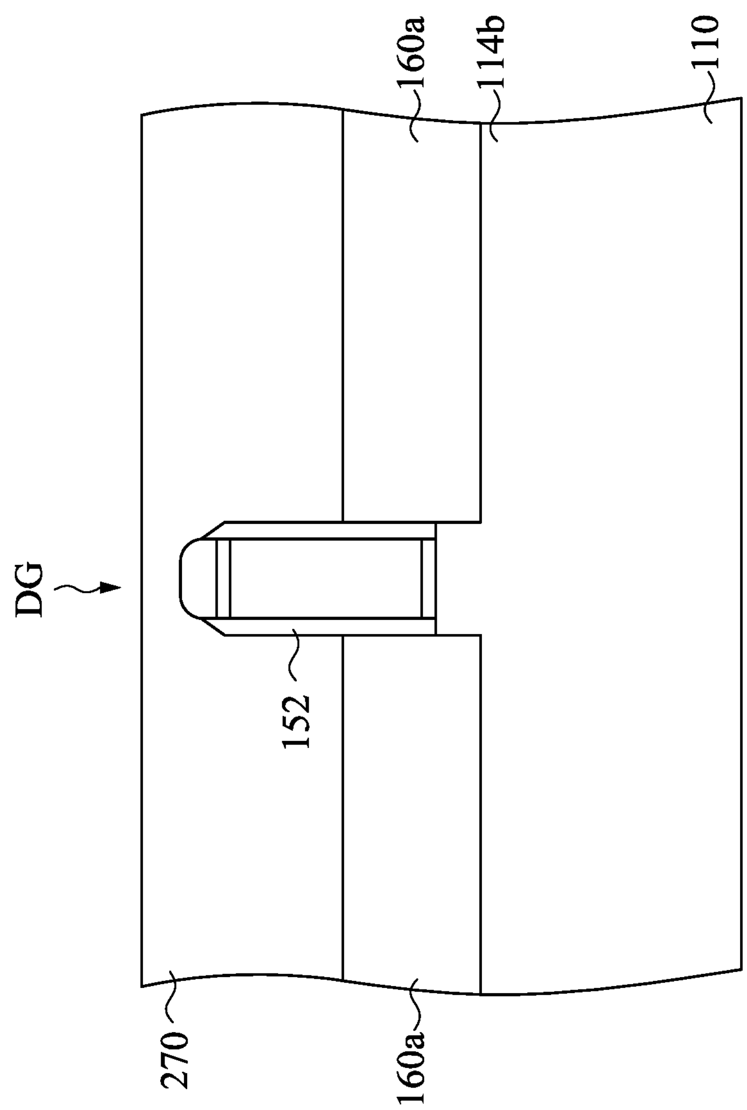

In operation S24, a clean process is performed to remove residues, as shown in FIGS. 8A-8C. Specifically, the clean process may be performed by a wet etching process (such as the Caro's cleaning process). In operation S24, the wafer W1 is dipped into a Caro's solution which is composed of sulfuric acid ($H_2SO_4$) having a concentration of about 95 to about 98% and hydrogen peroxide ($H_2O_2$) having a concentration of about 30 to about 40%. The ratio of $H_2SO_4$ to $H_2O_2$ is about 4 to 1. The Caro's dip removes the residue resulting in a clean wafer surface.

Figure 8D:
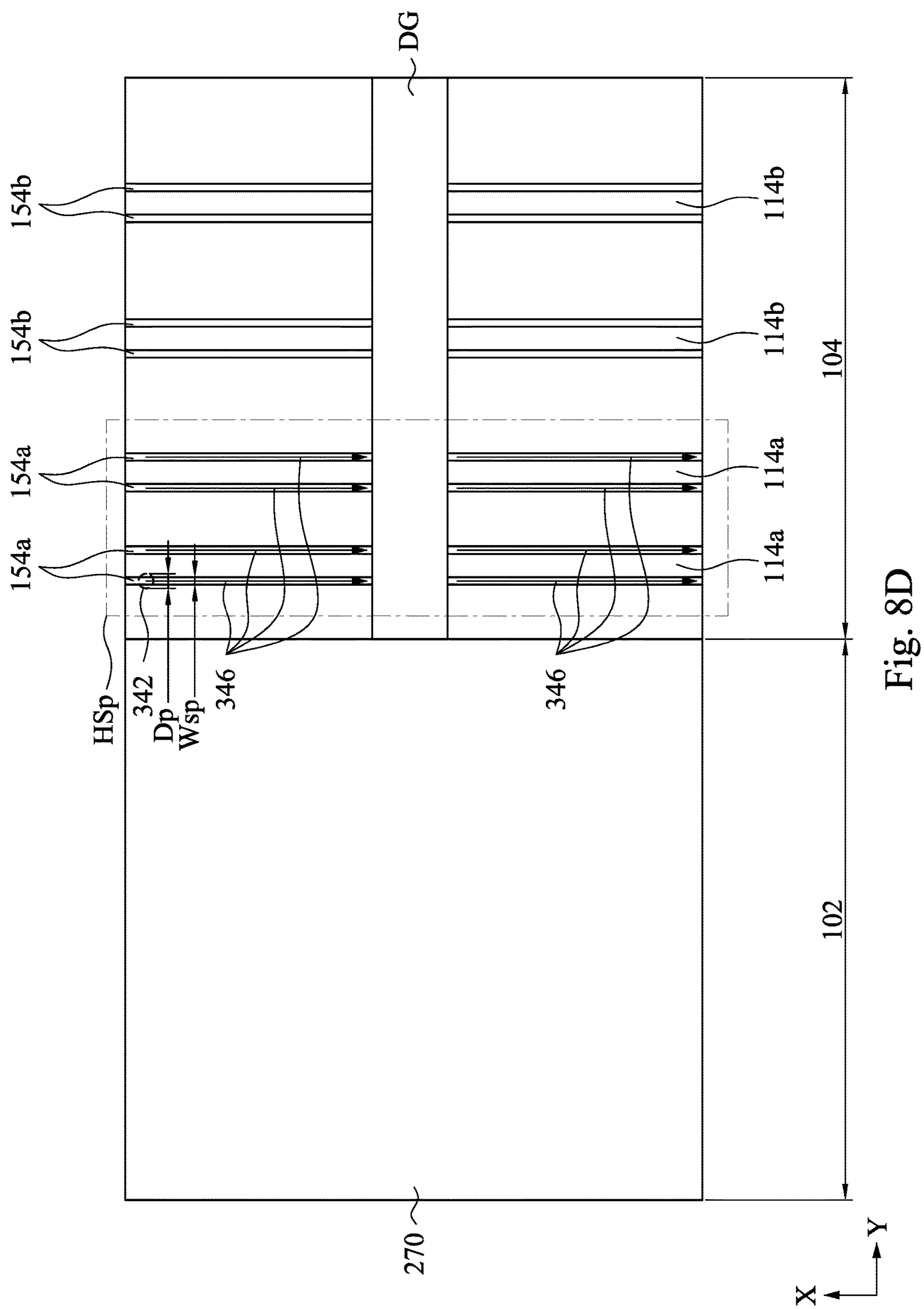
FIG. 8D is a schematic top view of FIG. 8A.

In operation S26 of FIG. 1A, an E-beam treatment is performed on the fin spacers 154*a* adjacent to the semiconductor fins 114*a*, as shown in FIGS. 8A-8D, where FIG. 8D is a schematic top view of FIG. 8A. Specifically, the first mask layer 260 in FIGS. 7A-7C is removed, and a second mask layer 270 is formed over the N region 102 of the substrate 110 while the P region 104 of the substrate 110 is exposed. That is, the semiconductor fins 112*a* and 112*b* and the N-type epitaxial structures 160*a* and 160*b* are covered by the second mask layer 270 while the semiconductor fins 114*a* and 114*b* are uncovered by the second mask layer 270.

Then, an E-beam treatment is performed on the fin spacers 154*a* adjacent to the semiconductor fins 114*a*. In some embodiments, a region HSp around the semiconductor fins 114*a* is a hot spot. In this case, the hot spot is the merge of adjacent epitaxial structures. That is, the epitaxial structures formed over the semiconductor fins 114*a* may be undesired merged while the epitaxial structures formed over the semiconductor fins 114*b* are separated from each other. In some embodiments, the hot spot region HSp may be determined in advance, as will be discussed in more detail in operation S44 below.

In FIG. 8D, an E-beam 342 is provided to the fin spacers 154*a* to charge the fin spacers 154*a* which is in the hot spot region HSp. In the meanwhile, the fin spacers 154*b* are not performed with the e-beam treatment, and thus the fin spacers 154*b* are not charged. In some embodiments, the e-beam 342 can be tuned to charge specific materials of the fin spacers 154*a*. For example, the wavelength, the energy, and/or other suitable properties of the e-beam 342 can be tuned according to the material of the fin spacers 154*a*. In some embodiments, the wavelength of the e-beam 342 can be in a range from about 0.01 nm to about 10 nm, the energy of the e-beam 342 can be in a range from about 50 eV to about 0.5 keV, and the e-beam 342 can be a laser, and the embodiments of this disclosure is not limited in this respect. If the parameter values are out of the above selected range, the e-beam 342 may not be successfully charge the fin spacers 154*a*.

Specifically, in some embodiments, the energy of the e-beam 342 can be determined according to Moseley's law. In this embodiment, the energy of the e-beam 342 is substantially proportional to $(Z-1)^2$, where Z is the atomic number of the material of the fin spacers 154*a*. For example, when the fin spacers 154*a* is made of silicon nitride, Z is the atomic number of silicon. The energy of the e-beam 342 is in a range from about 50 eV to about 0.5 keV if the fin spacers 154*a* is made of silicon nitride. The fin spacers 154*a* would not absorb the energy of the e-beam 342 if the energy is out of the range from about 50 eV to about 0.5 keV. Thus, the fin spacers 154*a* can not be charged.

In FIG. 8D, the fin spacer 154*a* has a width Wsp, and the e-beam 342 has a beam size (diameter) Dp in a range of about 0.5 Wsp to about 1.5 Wsp. If the beam size Dp is smaller than 0.5 Wsp, the e-beam 342 may not successfully charge the fin spacers 154*a*; if the beam size Dp is greater than 1.5 Wsp, the e-beam 342 may undesirably charge other elements. Further, the e-beam 342 moves along a direction 346 that is substantially parallel to the extension direction of the fin spacers 154*a* (i.e., the extension direction of the semiconductor fin 114*a*) to charge the fin spacer 154*a* from one end to another end. In some embodiments, the e-beam 342 charges the fin spacers 154*a* one by one. After the e-beam treatment, the fin spacers 154*a* are negative charged, and the fin spacers 154*b* are substantially neutral.

In some embodiments, the operations S24-S26 are in-situ performed; in some other embodiments, the operations S24-S26 are ex-situ performed. If the operations S24-S26 are in-situ performed, the e-beam treatment may be performed using the cluster tool 300 in FIG. 13, and if the operations S24-S26 are ex-situ performed, the e-beam treatment may be performed using the cluster tool 300 in FIG. 14.

Figure 9A:
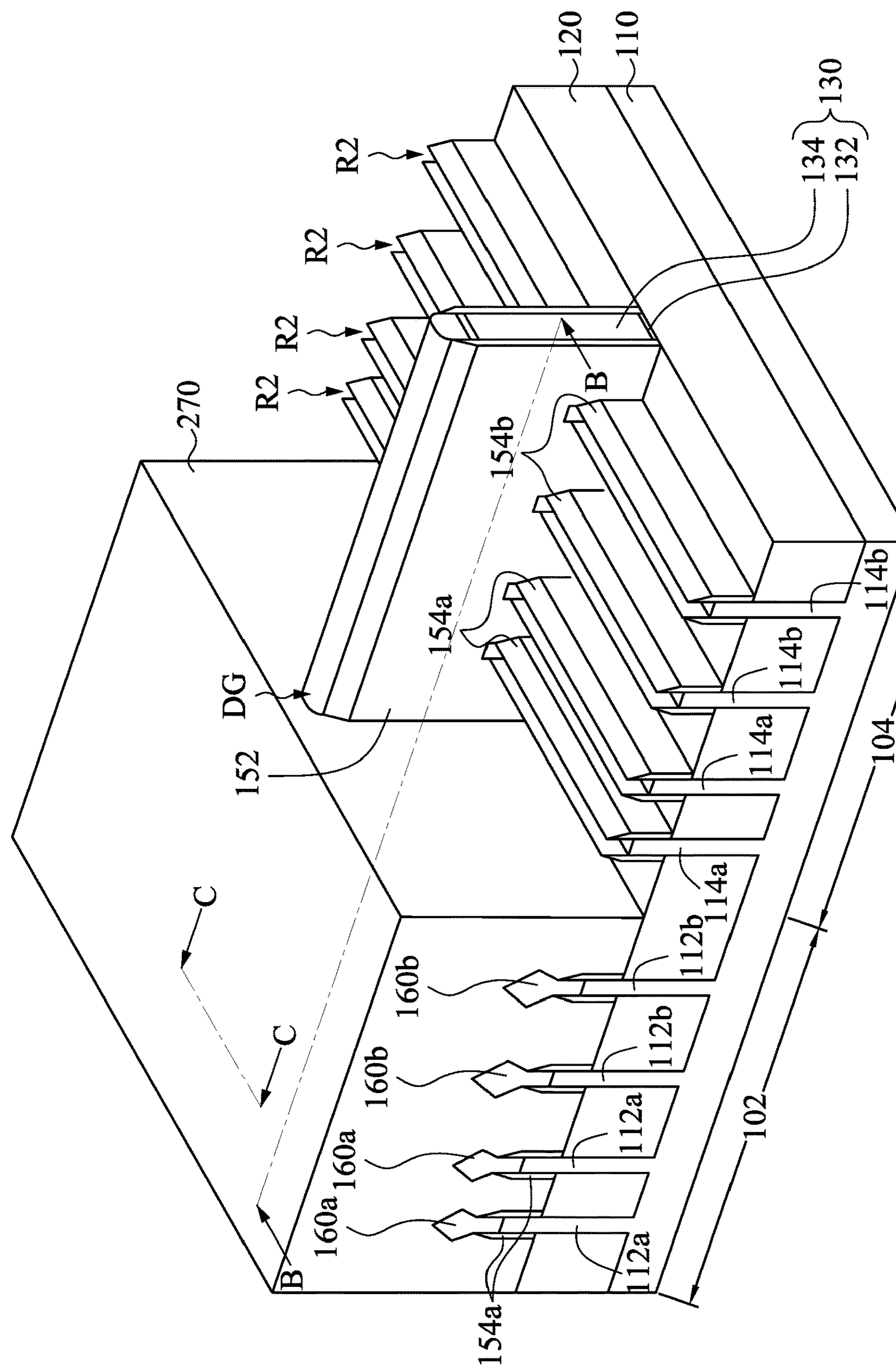
Figure 9B:
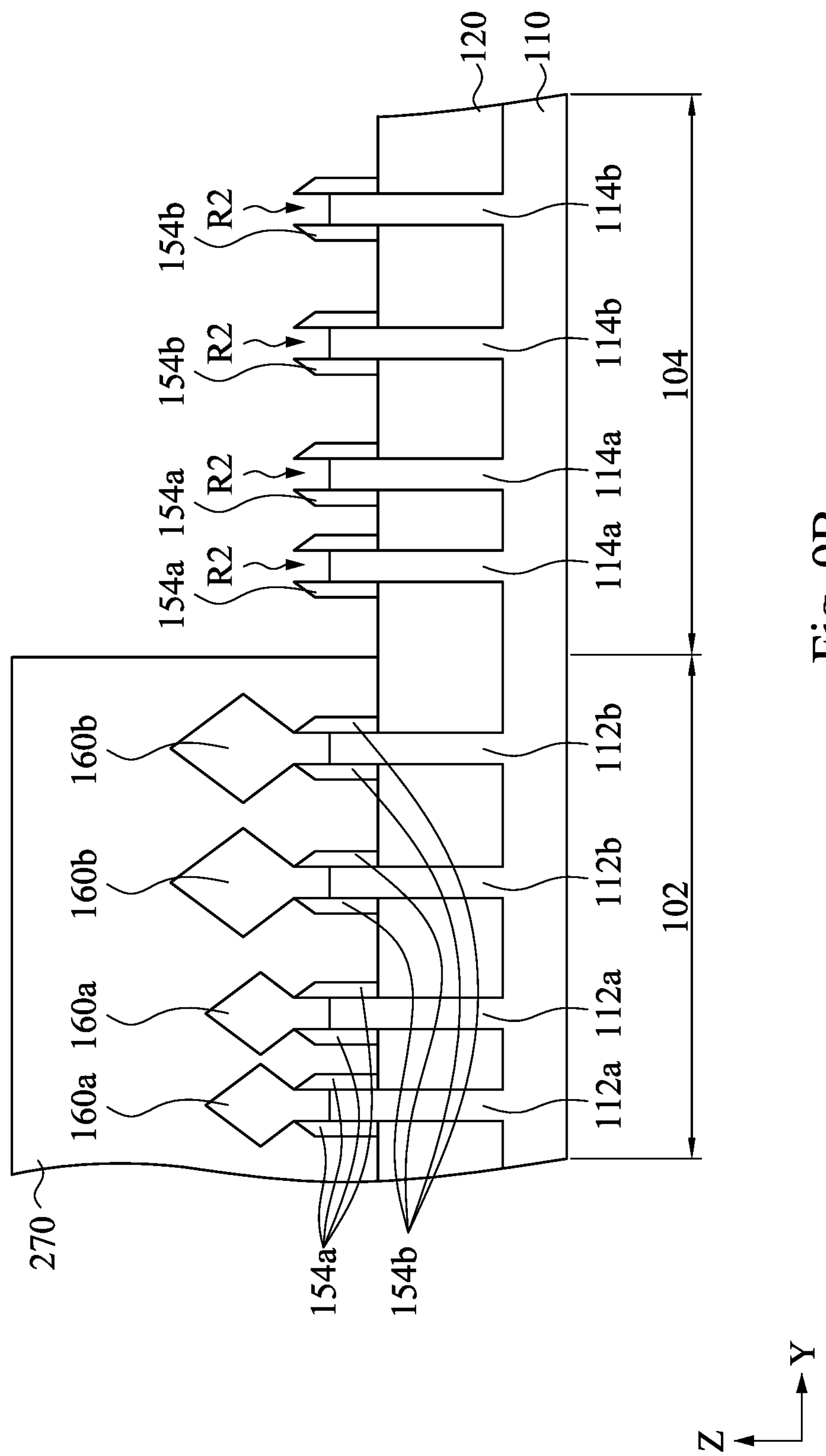
Figure 9C:
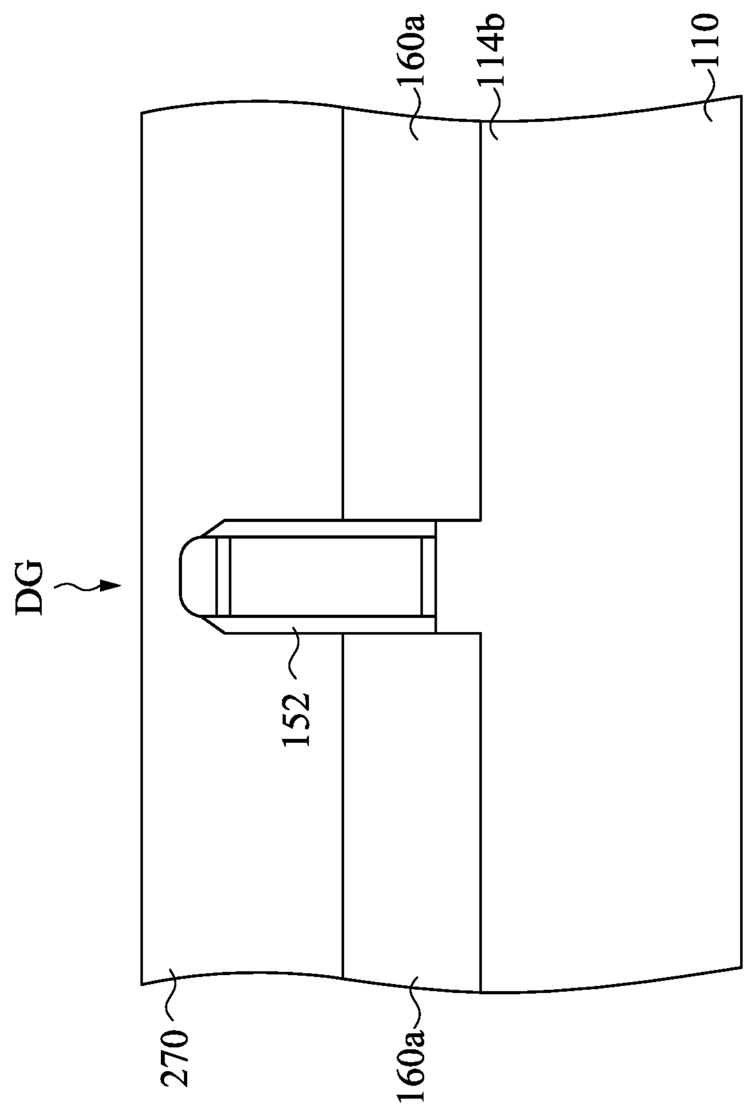

In operation S28 of FIG. 1B, the semiconductor fins 114*a* and 114*b* are recessed, as shown in FIGS. 9A-9C. Portions of the semiconductor fins 114*a* and 114*b* exposed both by the dummy gate stacks DG and the gate spacers 152 are partially removed (or partially recessed) to form recesses R2 in the semiconductor fins 114*a* and 114*b*. In FIGS. 9A-9C, the recesses R2 are formed with the fin spacers 154*a* and 154*b* as their upper portion, where e-beam treatment is performed on the fin spacers 154*a* and not on the fin spacers 154*b*. In some embodiments, the recesses R2 in the semiconductor fins 114*a* and 114*b* have the same depth.

The recessing process may include dry etching process, wet etching process, and/or combination thereof. The recessing process may also include a selective wet etch or a selective dry etch. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 10A:
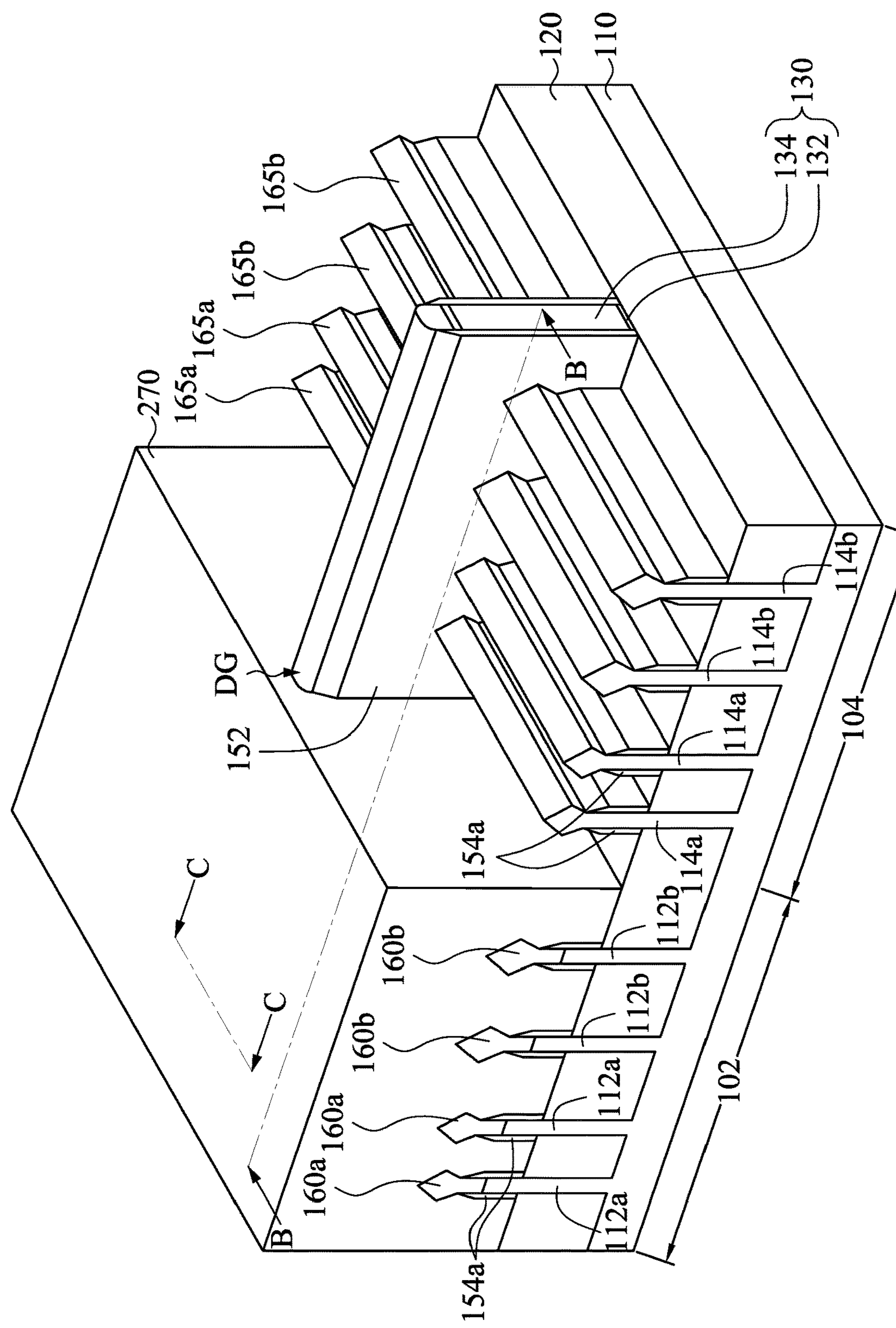
Figure 10B:
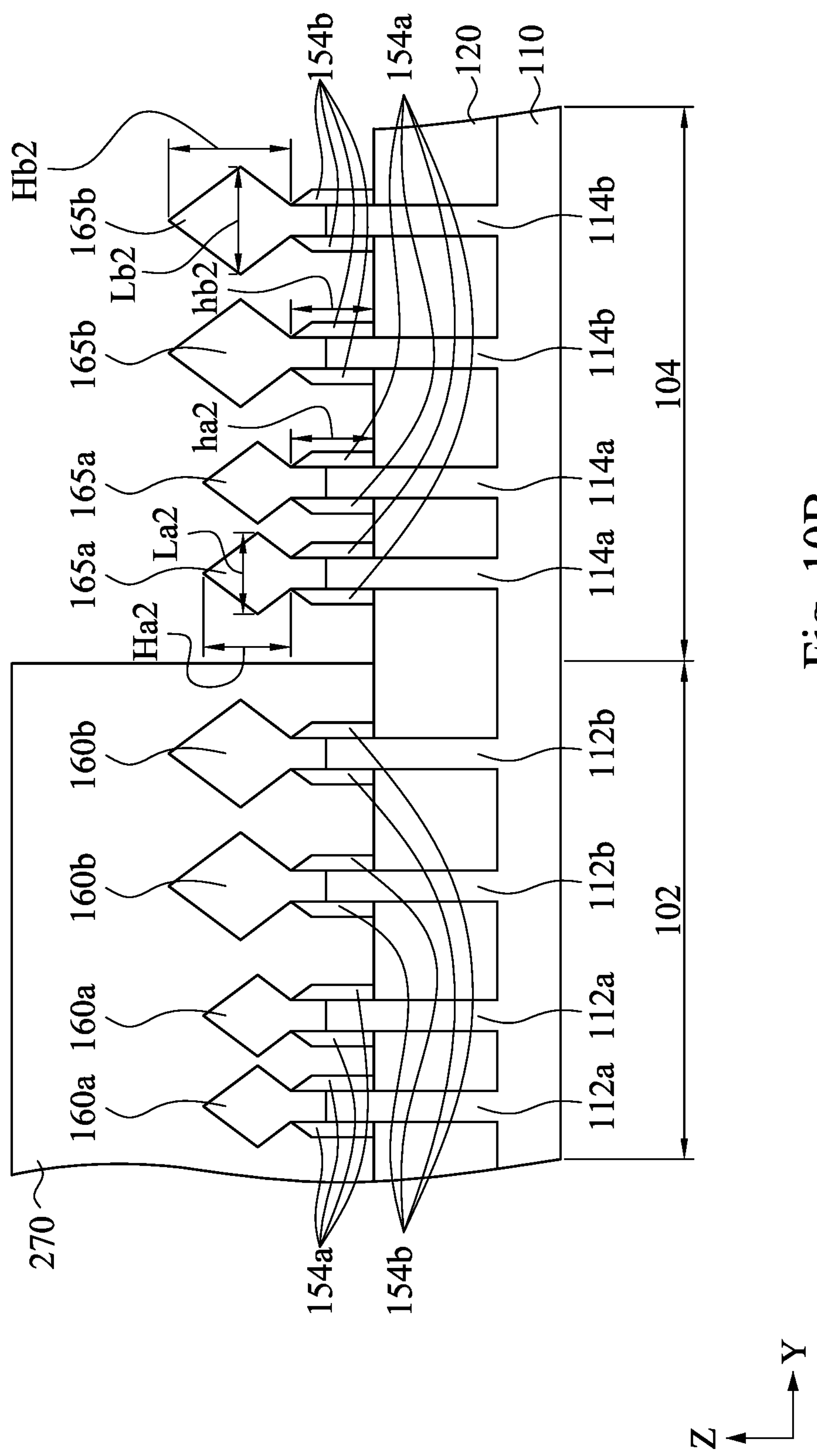
Figure 10C:
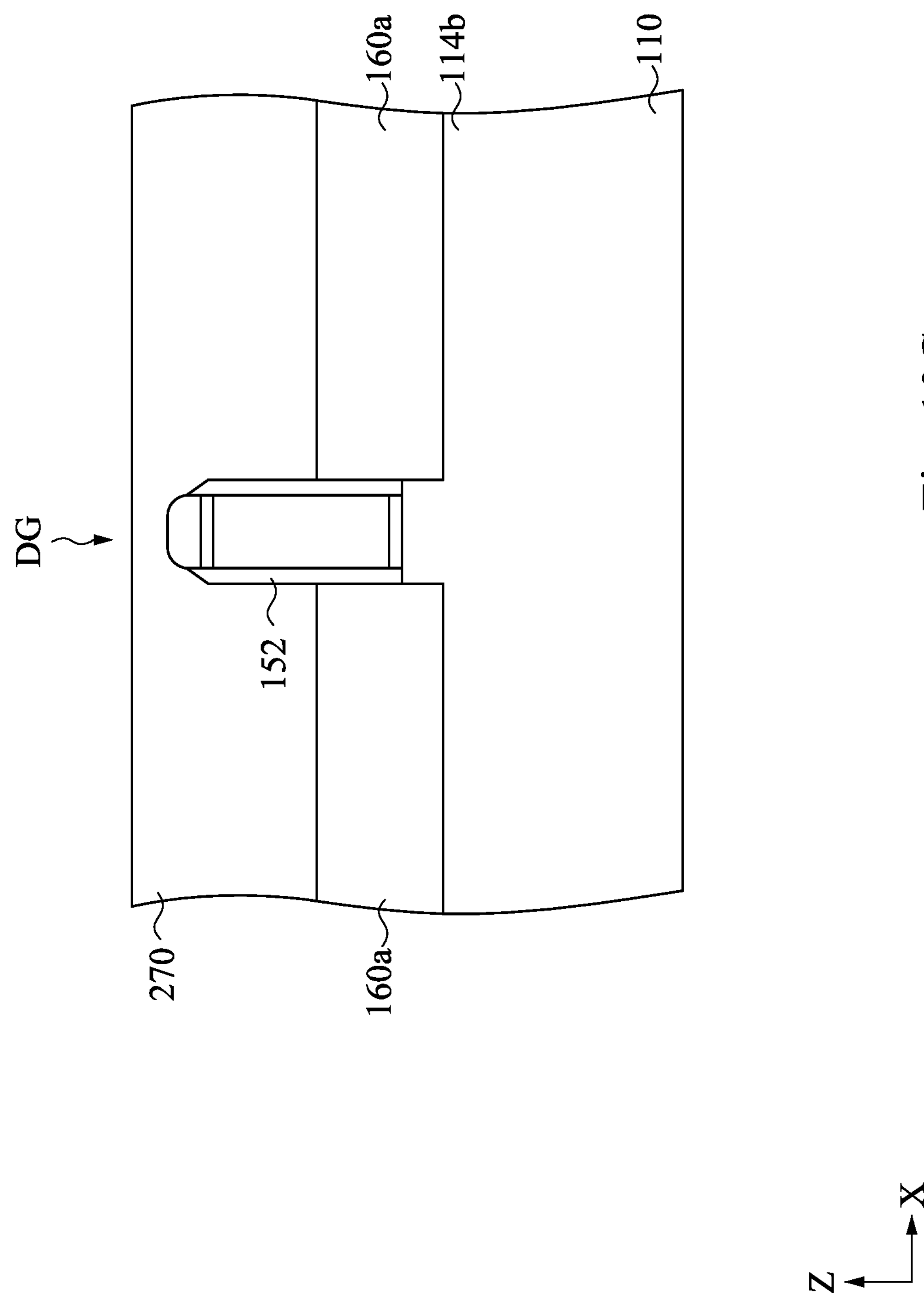

In operation S30, P-type epitaxial structures 165*a* and 165*b* are respectively formed in the recesses R2 and respectively over portions of the semiconductor fins 114*a* and 114*b* uncovered by the dummy gate stacks DG and the gate spacers 152, as illustrated in FIGS. 10A-10C. The P-type epitaxial structures 165*a* and 165*b* are formed by performing, for example, a selectively growing process. The P-type epitaxial structures 165*a* and 165*b* have suitable crystallographic orientations (e.g., a (100), (110), or (111) crystallographic orientation). In some embodiments, the P-type epitaxial structures 165*a* and 165*b* both have facets, and the crystallographic orientations of the facets of the P-type epitaxial structures 165*a* and 165*b* are the same. In some embodiments, the P-type epitaxial structures 165*a* and 165*b* may include an epitaxially growing silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes.

In FIG. 10B, the P-type epitaxial structures 165*a* and 165*b* have different sizes. Specifically, since the fin spacers 154*a* are negatively charged, the materials (mostly are positively charged) for growing the P-type epitaxial structures 165*a* are biased by the fin spacers 154*a* and thus hard to formed over the semiconductor fins 114*a* (and over the fin spacers 154*a*). In other words, the growth of the P-type epitaxial structures 165*a* is suppressed by the fin spacers 154*a*. In contrary, since the fin spacers 154*b* are not charged, the growth of the P-type epitaxial structures 165*b* is not suppressed. That is, the growth rate of the P-type epitaxial structures 165*b* is greater than the growth rate of the P-type epitaxial structures 165*a*.

In some embodiments, since the negative charges in the fin spacers 154*a* are discharged as time goes on, the Q-time between operations S26 to S30 may be shorter than about 1 day, or shorter than about 12 hours. If the Q-time is longer than about 1 day, the fin spacers 154*a* may not suppress the growth of the P-type epitaxial structures 165*a*.

In FIG. 10B, since the fin spacers 154*a* and 154*b* are formed together, the height ha2 of the fin spacers 154*a* is substantially the same as the height hb2 of the fin spacers 154*b*. However, since the P-type epitaxial structures 165*b* grow faster than the P-type epitaxial structures 165*a*, the height Ha2 of the P-type epitaxial structures 165*a* is less than the height Hb2 of the P-type epitaxial structures 165*b*, and the lateral width La2 of the P-type epitaxial structures 165*a* is less than the lateral width Lb2 of the P-type epitaxial structures 165*b*. In other words, the P-type epitaxial structures 165*a* and 165*b* have similar shapes but with different sizes. As such, the e-beam treatment prevents the P-type epitaxial structures 165*a* from being merged.

Figure 11A:
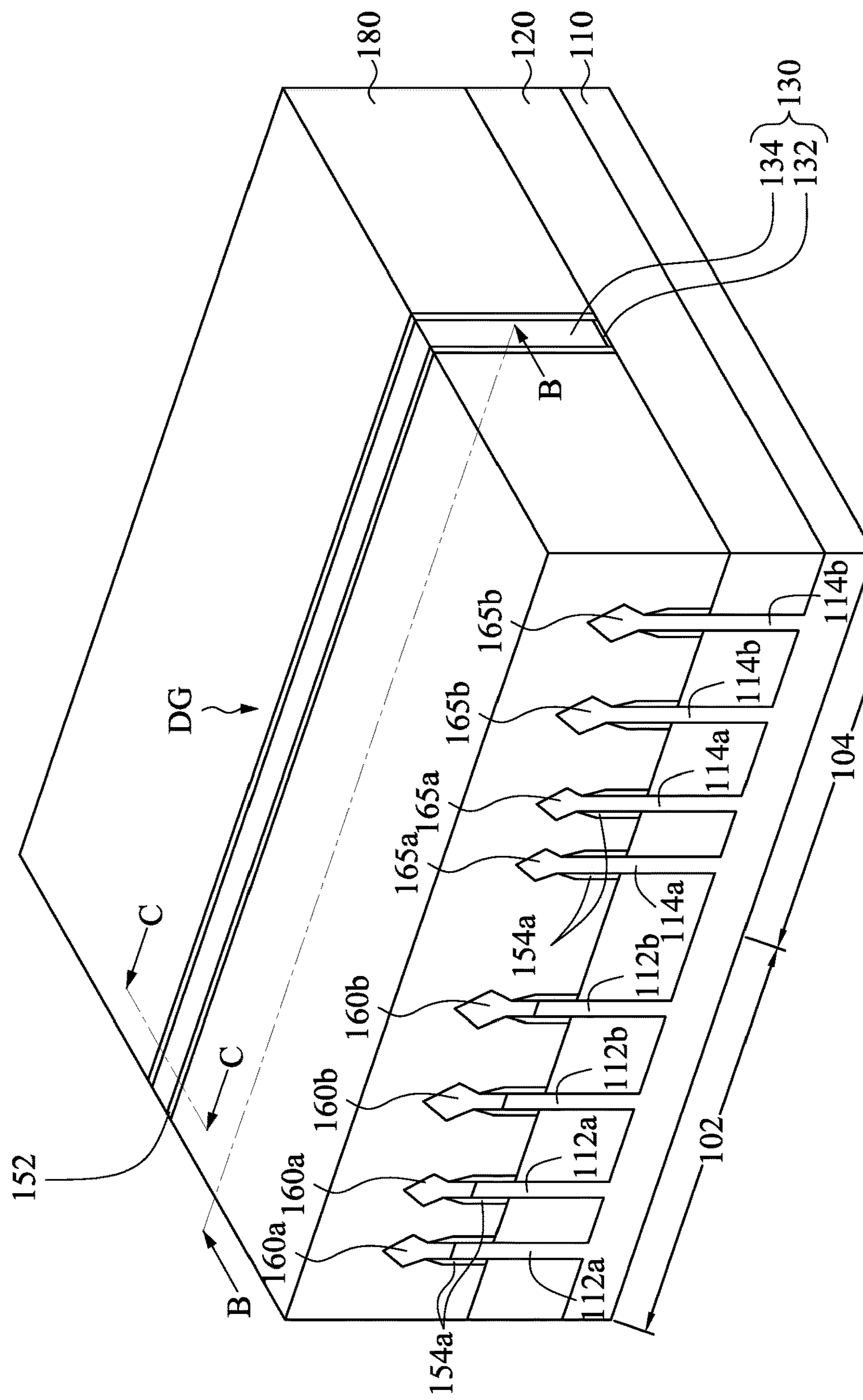
Figure 11B:
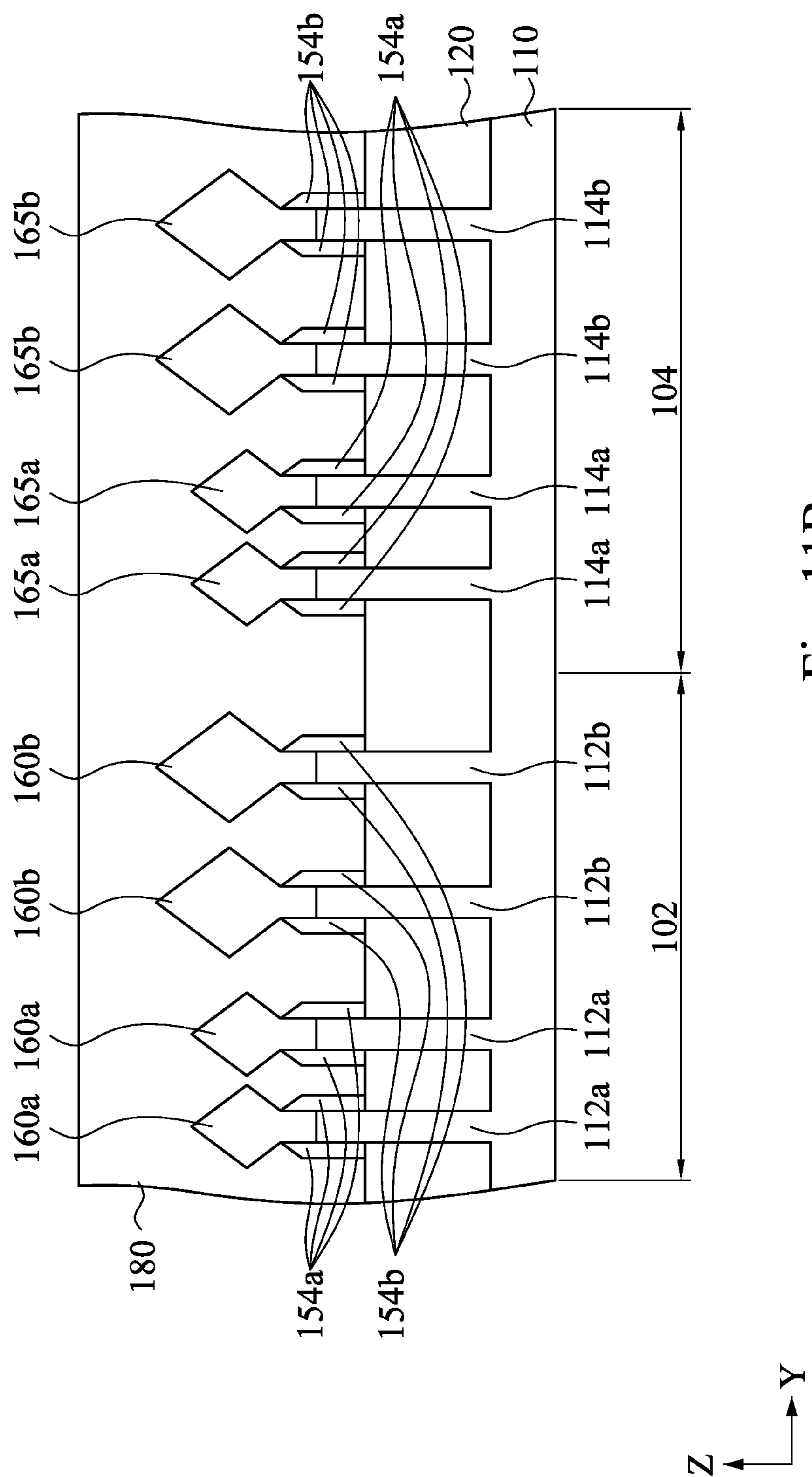
Figure 11C:
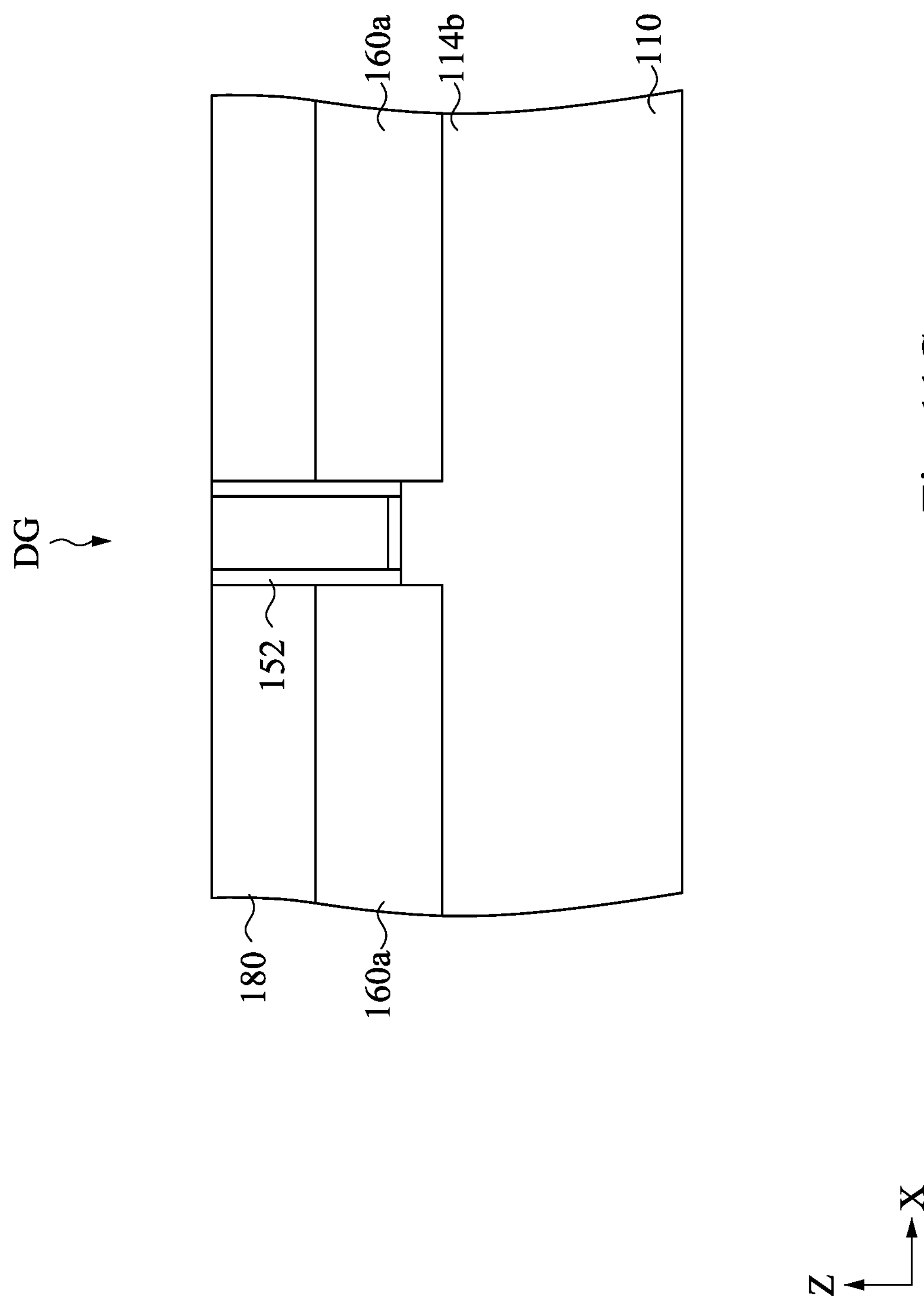

In operation S32 of FIG. 1B, a clean process is performed to remove residues, as shown in FIGS. 11A-11C. Specifically, the clean process may be performed by a wet etching process (such as the Caro's cleaning process). In operation S32, the wafer W1 is dipped into a Caro's solution. The Caro's dip removes the residue resulting in a clean wafer surface.

In operation S34 of FIG. 1B, an inspection is performed on the N-type and P-type epitaxial structures 160*a*, 160*b*, 165*a*, and 165*b*. Specifically, the second mask layer 270 in FIGS. 11A-11C is removed, and the inspection is performed on the wafer W1 and thus evaluates a surface of the wafer W1. The inspection may evaluate if adjacent epitaxial structures are unwanted merged. If yes, the location of the unwanted merged epitaxial structures is labeled as a hot spot, and the e-beam treatment is performed on the corresponding hot spot location in the next wafer. In some embodiments, the inspection may be performed in the e-beam chamber 380 of FIG. 14. That is, the e-beam chamber 380 is the inspection tool for inspecting the wafer W1, and the measurement apparatus 390 of FIG. 14 may be configured for inspecting the wafer W1.

In operation S42 of FIG. 1A, the hot spot region(s) HSn in N region 102 is/are determined. For example, a wafer without the e-beam treatment is disposed in an inspection tool (e.g., the inspection tool 380 of FIG. 14) to perform the inspection on the N-type epitaxial structures. The inspection evaluates if adjacent N-type epitaxial structures are unwanted merged. If yes, the location of the unwanted merged epitaxial structures is labeled as a hot spot. The operation S18 is performed after the operation S42.

In operation S44 of FIG. 1B, the hot spot region(s) HSp in P region 104 is/are determined. For example, a wafer without the e-beam treatment is disposed in an inspection tool (e.g., the inspection tool 380 of FIG. 14) to perform the inspection on the N-type epitaxial structures. The inspection evaluates if adjacent P-type epitaxial structures are unwanted merged. If yes, the location of the unwanted merged epitaxial structures is labeled as a hot spot. The operation S26 is performed after the operation S44. In some embodiments, the operations S42 and S44 are performed in the same inspection process. That is, the hot spots in N region 102 and in P region 104 are determined in the same inspection process.

In some embodiments, the e-beam treatment (the operations 18 and 26) may include a machining learning process. Specifically, the locations of the hot spots in N region 102 and/or in P region 104 may be determined with the inspection tool as respectively shown in operation S42 of FIG. 1A and operation S44 of FIG. 1B, and the locations of the hot spots are stored as a database. The e-beam treatment can be performed according to the database to save the manufacturing time. In some other embodiments, the machining learning process may include collecting the locations of the hot spots of wafers in the same lab or in the same factory to build a huge database, and the present disclosure is not limited in this respect.

In operation S36 of FIG. 1B, a dielectric layer 180 is formed over the dummy gate stack DG, the N-type and P-type epitaxial structures 160*a*, 160*b*, 165*a*, and 165*b*, the gate spacers 152, and the fin spacers 154*a* and 154*b*, as illustrated in FIGS. 11A-11C. In some embodiments, the dielectric layer 180 is formed over the structure of FIG. 11A-11C (after the second mask layer 270 is removed), followed by removing an excessive material of the dielectric layer 180 to expose the dummy gate structures 106 by using, for example, a CMP process. The CMP process may planarize a top surface of the dielectric layer 180 with top surfaces of the dummy gate structure 130 and the gate spacers 152. In some embodiments, the dielectric layer 180 includes silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The dielectric layer 180 may be formed using, for example, CVD, ALD, spin-on-glass (SOG) or other suitable techniques. In some embodiments, the dielectric layer 180 is a multi-layered structure including a contact etch stop layer (CESL) and an interlayer dielectric (ILD) over the CESL, wherein the ILD has a different etch selectivity than the CESL.

Figure 12A:
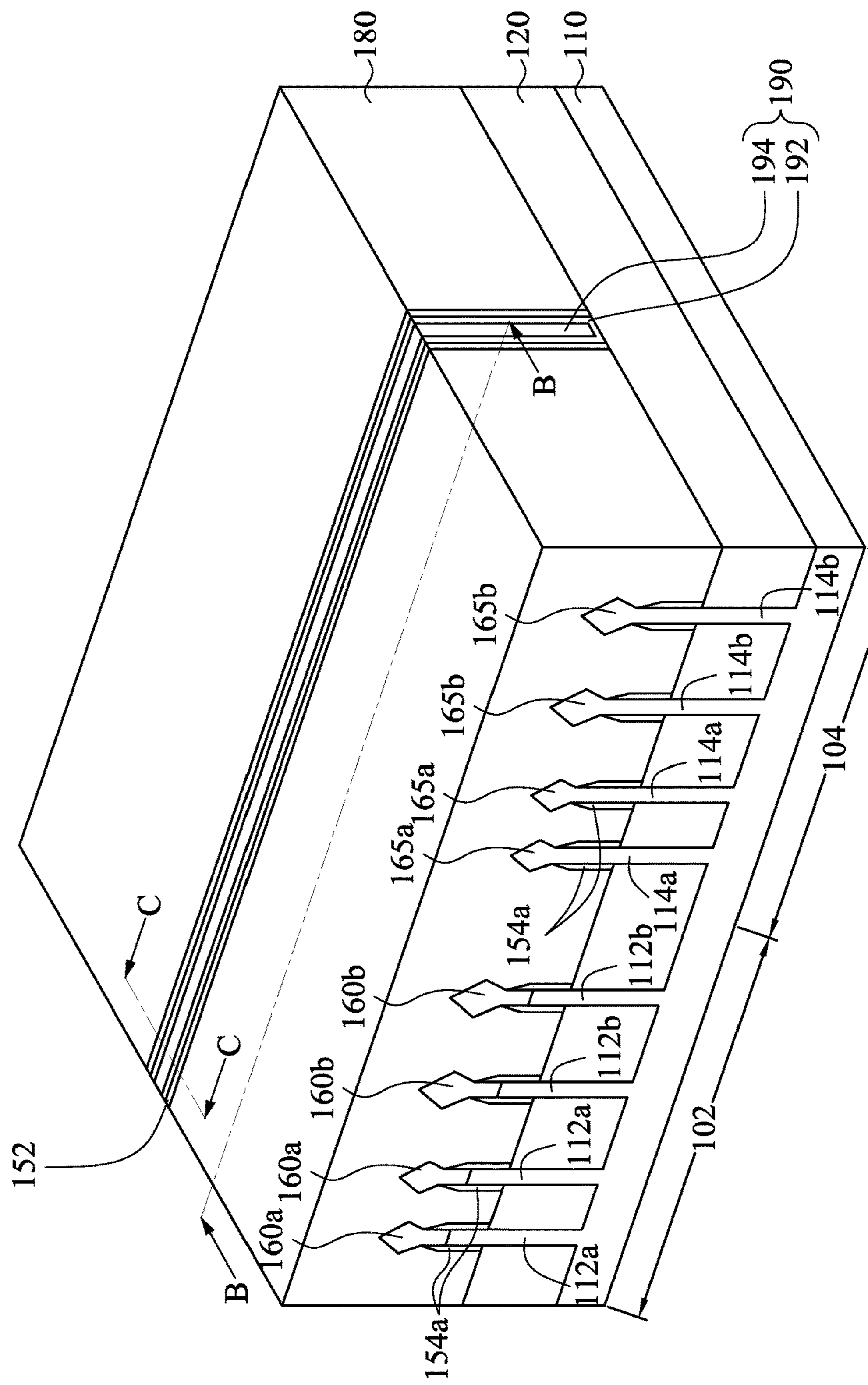
Figure 12B:
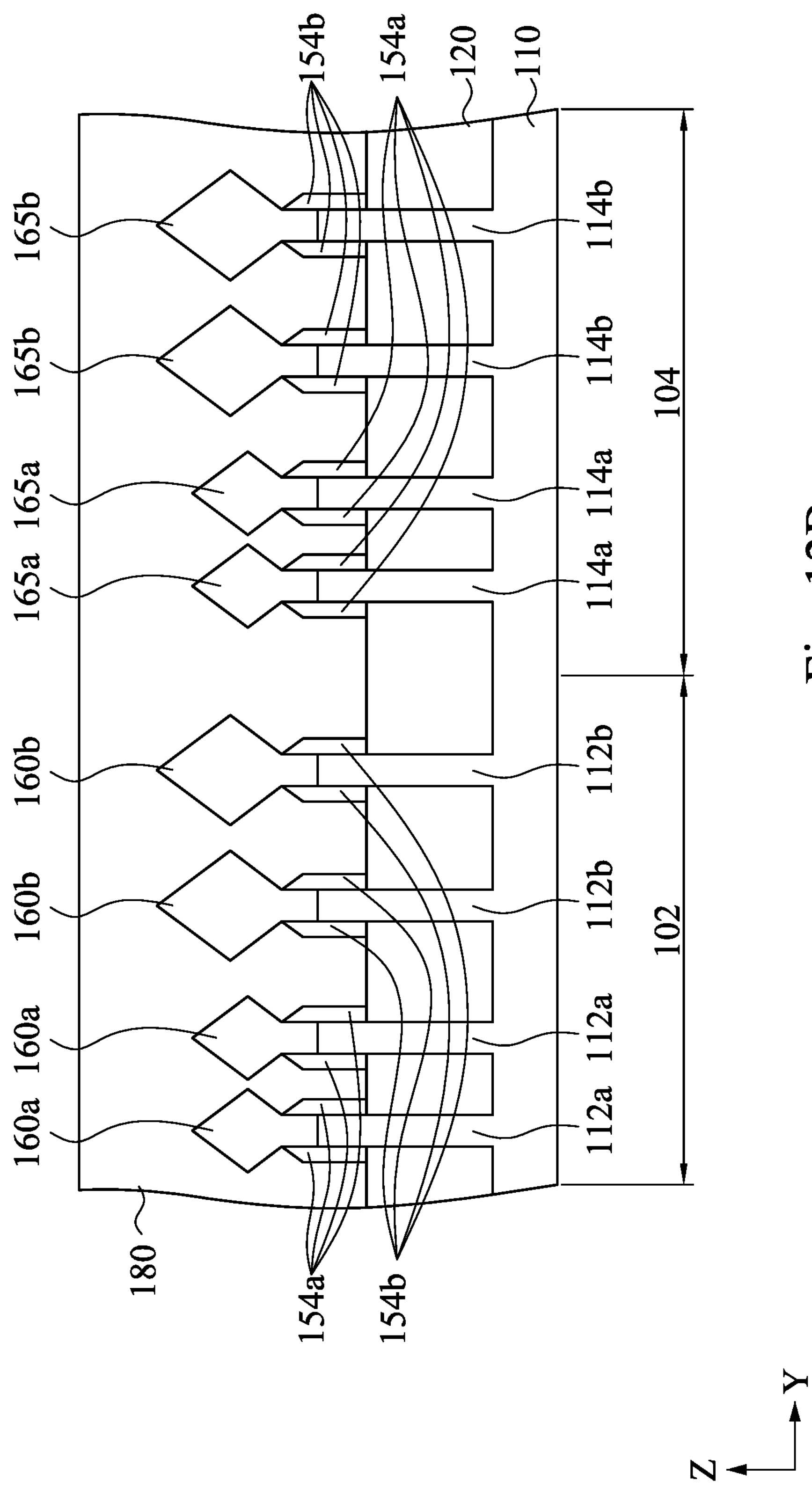
Figure 12C:
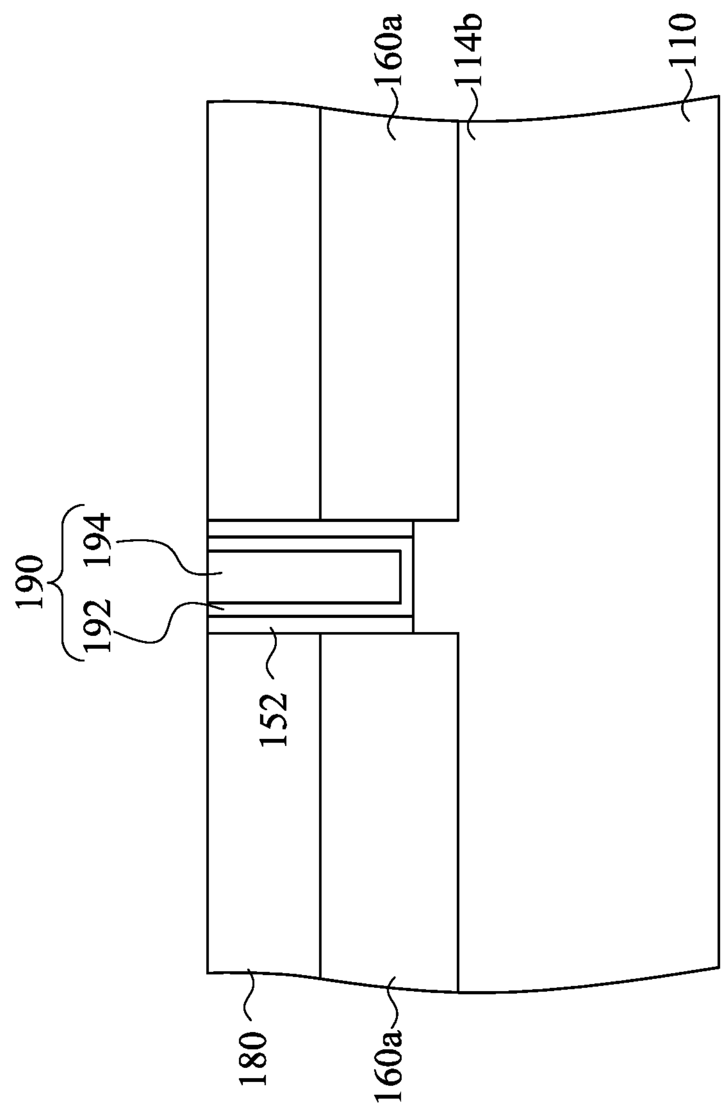

In operation S38 of FIG. 1B, the dummy gate structure 130 is replaced with a replacement gate stack 190, as illustrated in FIGS. 12A-12C. Specifically, a replacement gate (RPG) process scheme is employed. In the RPG process scheme, a dummy polysilicon gate (the dummy gate structure 130 (see FIG. 11A) in this case) is formed in advance and is replaced later by a metal gate. In some embodiments, the dummy gate structure 130 is removed to form an opening with the gate spacers 152 as its sidewalls. In some other embodiments, the dummy dielectric layer 132 (see FIG. 11A) is removed as well. Alternatively, in some embodiments, the dummy gate structure 130 is removed while the dummy dielectric layer 132 retains. The dummy gate structure 130 is (and the dummy dielectric layer 132) may be removed by dry etch, wet etch, or a combination of dry and wet etch. For example, a wet etch process may include exposure to a hydroxide containing solution (e.g., ammonium hydroxide), deionized water, and/or other suitable etchant solutions.

A gate dielectric layer 192 is conformally formed in the openings. The gate dielectric layer 192 is over the semiconductor fins 112*a*, 112*b*, 114*a*, and 114*b*. The gate dielectric layer 192 may be a high-κ dielectric layer having a dielectric constant (κ) higher than the dielectric constant of $SiO_2$, i.e. κ>3.9. The gate dielectric layer 192 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The gate dielectric layer 192 is deposited by suitable techniques, such as ALD, CVD, PVD, thermal oxidation, combinations thereof, or other suitable techniques.

At least one metal layer is formed in the openings and on the gate dielectric layer 192. Subsequently, a chemical mechanical planarization (CMP) process is performed to planarize the metal layer and the gate dielectric layer 192 to form the metal gate stack 190 in the opening. The metal gate stack 190 cross over the semiconductor fins 112*a*, 112*b*, 1124*a*, and 114*b*, which are separated from the isolation structures 120. The metal gate stack 190 includes the gate dielectric layer 192 and a metal gate electrode 194 over the gate dielectric layer 192. The metal gate electrode 194 may include work function metal layer(s), capping layer(s), fill layer(s), and/or other suitable layers that are desirable in a metal gate stack. The work function metal layer may include n-type and/or p-type work function metal. Exemplary n-type work function metals include Ti, Ag, TaAl, TaAlC, TiAlN, TaC, TaCN, TaSiN, Mn, Zr, other suitable n-type work function materials, or combinations thereof. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. The work function metal layer may have multiple layers. The work function metal layer(s) may be deposited by CVD, PVD, electroplating and/or other suitable process. In some embodiments, the metal gate electrode 194 is a p-type metal gate including a p-type work function metal layer. In some embodiments, the capping layer in the metal gate electrode 194 may include refractory metals and their nitrides (e.g. TiN, TaN, $W_2N$, TiSiN, TaSiN). The capping layer may be deposited by PVD, CVD, metal-organic chemical vapor deposition (MOCVD) ALD, or the like. In some embodiments, the fill layer in the metal gate electrodes 194 may include tungsten (W). The fill layer may be deposited by ALD, PVD, CVD, or other suitable process.

It is noted that although in the case of FIGS. 1A and 1B, the fin spacers 154*a* over the N region 102 and the P-region 104 are treated by the e-beam, in some other embodiments, however, the e-beam treatment may only be performed on the fin spacers 154*a* over the N region 102 (i.e., the operation S18 is omitted) or on the fin spacers 154*a* over the P region 104 (i.e., the operation S26 is omitted). The e-beam treatment is performed based on the location of the hot spots.

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that unwanted merged source/drain regions can be prevented because of the e-beam treatment performed on the fin spacers. Another advantage is that increased throughput and hence reduced fabrication cost can be provided, because the e-beam treatment may be performed with a machining learning process.

According to some embodiments, a method for manufacturing a semiconductor device includes forming a semiconductor fin over a substrate. A fin spacer is formed on a sidewall of the semiconductor fin. An e-beam treatment is performed on the fin spacer. An epitaxial structure is formed over the semiconductor fin. The epitaxial structure is in contact with the e-beam treated fin spacer.

According to some embodiments, a method for manufacturing a semiconductor device includes determining a location of a hot spot region. Semiconductor fins are over a substrate. Fin spacers are respectively on sidewalls of the semiconductor fins. Portions of the fin spacers are in the hot spot region. The portion of the fin spacers in the hot spot region are charged. Epitaxial structures are respectively formed over the semiconductor fins.

According to some embodiments, a semiconductor device includes a first semiconductor fin, a second semiconductor fin, a first fin spacer, a second fin spacer, a first epitaxial structure, and a second epitaxial structure. The first fin spacer is in contact with the first semiconductor fin. The first fin spacer has a first height. The second fin spacer is in contact with the second semiconductor fin. The second fin spacer has a second height substantially the same as the first height. The first epitaxial structure is over the first semiconductor fin and the first fin spacer. The first epitaxial structure has a third height. The second epitaxial structure is over the second semiconductor fin and the second fin spacer. The second epitaxial structure is adjacent to the first epitaxial structure and has a fourth height different from the third height.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device comprising:
- forming a semiconductor fin over a substrate;
- forming a fin spacer on a sidewall of the semiconductor fin;
- performing an e-beam treatment on the fin spacer;
- determining energy of an e-beam of the e-beam treatment according to Moseley's law; and
- forming an epitaxial structure over the semiconductor fin, wherein the epitaxial structure is in contact with the e-beam treated fin spacer.

2. The method of claim 1, wherein a beam size of the e-beam is about 0.5 Ws to about 1.5 Ws, where Ws is a width of the fin spacer.

3. The method of claim 1, wherein the fin spacer comprises silicon, and the energy of the e-beam is about 50 eV to about 0.5 keV.

4. The method of claim 1, wherein performing the e-beam treatment comprises:
- providing the e-beam on the fin spacer; and
- moving the e-beam along a direction substantially parallel to an extension direction of the fin spacer.

5. The method of claim 1, further comprising recessing the semiconductor fin.

6. The method of claim 5, wherein the e-beam treatment is performed before the semiconductor fin is recessed.

7. The method of claim 1, wherein a queue time between performing the e-beam treatment and forming the epitaxial structure is shorter than about 1 day.

8. The method of claim 1, wherein forming the fin spacer and performing the e-beam treatment are in-situ performed.

9. A method for manufacturing a semiconductor device comprising:
- determining a location of a hot spot region;
- forming semiconductor fins over a substrate;
- forming fin spacers respectively on sidewalls of the semiconductor fins, wherein a portion of the fin spacers is in the hot spot region;
- charging the portion of the fin spacers in the hot spot region; and
- forming epitaxial structures respectively over the semiconductor fins.

10. The method of claim 9, wherein charging the portion of the fin spacers in the hot spot region comprises leaving a portion of the fin spacers outside the hot spot region uncharged.

11. The method of claim 9, wherein the semiconductor fins have the same conductivity type.

12. The method of claim 9, wherein the location of the hot spot region is determined in an inspection tool, and charging the portion of the fin spacers is performed in the inspection tool.

13. A semiconductor device comprising:
- a first semiconductor fin and a second semiconductor fin;
- a pair of first fin spacers in contact with the first semiconductor fin, wherein each of the first fin spacers has a first height;
- a pair of second fin spacers in contact with the second semiconductor fin, wherein each of the second fin spacers has a second height substantially the same as the first height;
- a first epitaxial structure over the first semiconductor fin and the first fin spacers, wherein an entirety of the first epitaxial structure is semiconductive, the first epitaxial structure has a third height, and the first epitaxial structure comprises a bottom portion sandwiched between the pair of the first fin spacers; and
- a second epitaxial structure over the second semiconductor fin and the second fin spacers, wherein an entirety of the second epitaxial structure is semiconductive, the second epitaxial structure is adjacent to the first epitaxial structure and has a fourth height different from the third height.

14. The semiconductor device of claim 13, wherein the first epitaxial structure has a first lateral width, and the second epitaxial structure has a second lateral width that is different from the first lateral width.

15. The semiconductor device of claim 14, wherein the fourth height is greater than the third height, and the second lateral width is greater than the first lateral width.

16. The semiconductor device of claim 13, wherein the first epitaxial structure and the second epitaxial structure are made of the same material.

17. The semiconductor device of claim 13, further comprising:
- a third semiconductor fin, wherein the first semiconductor fin is between the second semiconductor fin and the third semiconductor fin; and
- a third epitaxial structure over the third semiconductor fin, wherein the third epitaxial structure is adjacent to and separated from the first epitaxial structure.

18. The semiconductor device of claim 17, wherein the first epitaxial structure and the third epitaxial structure are made of the same material.

19. The semiconductor device of claim 18, further comprising a third fin spacer in contact with the third semiconductor fin, wherein the third fin spacer has a fifth height substantially the same as the first height.

20. The semiconductor device of claim 13, wherein the second epitaxial structure comprises a bottom portion sandwiched between the pair of the second fin spacers, and the bottom portions of the first and second epitaxial structures have substantially the same depth.

* * * * *